United States Patent [19]
Nishimoto et al.

[11] Patent Number: 5,315,560
[45] Date of Patent: May 24, 1994

[54] SEMICONDUCTOR MEMORY DEVICE HAVING A WRITE PER BIT FUNCTION IN PAGE MODE

[75] Inventors: Masaki Nishimoto; Junko Matsumoto, both of Hyogo, Japan

[73] Assignee: Mitsubishi Denki Kabushiki Kaisha, Tokyo, Japan

[21] Appl. No.: 961,577

[22] Filed: Oct. 15, 1992

[30] Foreign Application Priority Data

May 25, 1992 [JP] Japan .................. 4-131190

[51] Int. Cl.[5] .................. G11C 8/00; G11C 7/00
[52] U.S. Cl. .................. 365/238.5; 365/189.05; 365/195
[58] Field of Search .......... 365/238.5, 230.03, 230.05, 365/230.09, 233, 195, 189.05; 395/164, 166; 340/799

[56] References Cited

U.S. PATENT DOCUMENTS

| | | | |
|---|---|---|---|
| 4,817,058 | 3/1989 | Pinkham | 365/238.5 |
| 4,951,251 | 8/1990 | Yamaguchi et al. | 365/230.02 |
| 4,962,486 | 10/1990 | Masuda et al. | 365/230.03 |
| 5,001,673 | 3/1991 | Norwood et al. | 365/238.5 |
| 5,134,582 | 7/1992 | Ishii | 365/238.5 |
| 5,134,589 | 7/1992 | Hamano | 365/238.5 |
| 5,148,396 | 9/1992 | Nakada | 365/238.5 |
| 5,198,804 | 3/1993 | Mori | 340/799 |

FOREIGN PATENT DOCUMENTS 63-234495  9/1988  Japan .
3-183097   8/1991  Japan .

Primary Examiner—Eugene R. LaRoche
Assistant Examiner—Son Dinh
Attorney, Agent, or Firm—Lowe, Price, LeBlanc & Becker

[57] ABSTRACT

A semiconductor memory device is provided with a plurality of input circuits each having a mask information generating circuit to enable bit writing in page mode. The mask information generating circuit generates mask information from a mask control signal supplied from a mask control circuit, mask data supplied from a mask data input buffer circuit, an internal signal and a special function signal. The mask information generating circuit controls the mask information, depending on the state of the special function signal at the fall of an external column address strobe signal such that the mask information may change on each column address strobe cycle.

14 Claims, 27 Drawing Sheets

FIG. 5

| | /CASI FALL | /MSKi | |
|---|---|---|---|
| | | MDi = H | MDi = L |
| MC = H | DSF = H | H | L |
| | DSF = L | H | H |
| MC = L | DSF = H | H | L |
| | DSF = L | H | L |

FIG. 10

| | /CAS FALL | /MSKi | |
| --- | --- | --- | --- |
| | | RMi = H | RMi = L |
| MC = H | DSF = H | H | L |
| | DSF = L | H | H |
| MC = L | DSF = H | H | L |
| | DSF = L | H | L |

FIG. 16

| | /CAS1 FALL | /MSKi | |
| --- | --- | --- | --- |
| | | MDi = H | MDi = L |
| MC = H | /W = L | H | L |
| | /W = H | H | H |
| MC = L | /W = L | H | L |
| | /W = H | H | L |

FIG. 20

| | /CASI FALL | | /MSKi | |
|---|---|---|---|---|
| | | | RMi = H | RMi = L |
| MC = H | /W = L | | H | L |
| | /W = H | | H | H |
| MC = L | /W = L | | H | L |
| | /W = H | | H | L |

SEMICONDUCTOR MEMORY DEVICE HAVING A WRITE PER BIT FUNCTION IN PAGE MODE

BACKGROUND OF THE INVENTION

1. Field of the Invention

The present invention relates to a semiconductor memory device, and in particular to a semiconductor memory device having a write per bit function in page mode.

2. Description of the Background Art

FIG. 22 is a block diagram showing a conventional semiconductor memory device having a write per bit function in page mode. Before describing the write per bit function in page mode, a construction and an operation of a semiconductor memory device in FIG. 22 will be described below.

This semiconductor memory device has the construction allowing input and output of 4-bit data in parallel. A memory array 1 includes four memory array blocks B0-B3. Each memory array block is disposed correspondingly to each bit of the data. Each of memory array blocks B0-B3 includes a plurality of memory cells disposed in plural rows and plural columns.

An RAS buffer 2 receives an external row address strobe signal /RAS and generates an internal signal /RASI. The internal signal /RASI has the same phase as the external row address strobe signal /RAS. A CAS buffer 3 receives an external column address strobe signal /CAS, and generates an internal signal /CASI. The internal signal /CASI has the same phase as the external column address strobe signal /CAS. A W-buffer 4 receives an external data write control signal /W, and generates an internal signal /WI. The internal signal /WI has the same phase as the external data write control signal (external write signal) /W.

A row address buffer 5 receives an external address signal Add and generates a row address signal in response to fall of the internal signal /RASI. A row decoder 6 decodes the row address signal, and selects one row in each of the memory array blocks B0-B3.

The data of one row read from the memory cells in the selected one row is amplified by a sense amplifier included in a sense amplifier and IO gate 7 and is held.

A column address buffer 8 receives the external address signal Add, and generates a column address signal in response to the internal signal /CASI. A column decoder 9 decodes the column address signal and selects one column in each of the memory array blocks B0-B3. Thereby, the data selected in each of the memory array blocks B0-B3 is transmitted through an IO gate included in the sense amplifier and IO gate 7 to corresponding one of input/output lines IO0-IO3.

In a write operation, the data externally applied to external data input terminals WIO0-WIO3 is sent through four input circuits 10 to the input/output lines IO0-IO3, respectively.

In a read operation, the data on the input/output lines IO0-IO3 is sent through four output circuits 11 to external data output terminals RIO0-RIO3, respectively. An output control circuit 12 controls the output circuits 11 in response to an external output enable signal /OE.

A timing generator 13 is responsive to the internal signals /RASI, /CASI and /WI to generate various timing signals. This semiconductor memory device is formed on a semiconductor chip CH.

Now, the write per bit function in page mode will be described below. In the page mode, the memory cells in the selected one row are sequentially selected by repetitively dropping the external column address strobe signal /CAS, while maintaining the state where one row in each memory array block is selected in response to the fall of the external row address strobe signal /RAS. This mode allows random access within a range of one row in the memory matrix at a higher speed than the normal mode and with lower power consumption. The write per bit function is a function inhibiting the write of an arbitrary bit of externally applied data.

The semiconductor memory device in FIG. 22 has the write per bit function in page mode. Now, a specific construction of the input circuit 10 in the semiconductor memory device in FIG. 22 will be described below, and further the write per bit function in page mode will be described.

FIG. 23 is a block diagram showing one of the input circuits 10. The input circuit 10 includes a mask data input buffer 101, a data input buffer 102 and an IO buffer 103.

The mask data input buffer 101 is responsive to the internal signals /RASI and /WI, and receives the data through an external data input terminal WIOi to generate mask data MDi. The mask data MDi forms mask information MSKi. Here, "i" represents an integer from 0 to 3.

The data input buffer 102 is responsive to the internal signals /CASI and /WI, and receives the data through the external data input terminal WIOi to generate write data DBi.

The IO buffer circuit 103 is responsive to the mask information /MSKi, and applies the write data DBi to the input/output line IOi or inhibit the input. The input/output line IOi includes two input/output lines IO and /IO receiving complementary data.

FIG. 24 is a circuit diagram showing a specific construction of a mask data input buffer circuit 101 shown in FIG. 23. The mask data input buffer circuit 101 includes inverters G1-G8, NOR gates G9 and G10, inverter circuits INV1 and INV2, and a latch circuit LT1.

When the internal signal /RASI and internal signal /WI go to "L", the output of inverter G1 goes to "L", and the output of NOR gate G10 is maintained at "H" for a predetermined time period. Thereby, the inverter circuit INV1 is activated, and the inverter circuit INV2 is maintained at an active state for the predetermined time period. Therefore, the data at external data input terminal WIOi is fetched through the inverter circuit INV1, inverter G8 and inverter circuit INV2 to the latch circuit LT1. The latch circuit LT1 latches the data and outputs the same as the mask information MDi.

FIG. 25 is a circuit diagram showing a specific construction of the data input buffer circuit 102 in FIG. 23. The data input buffer circuit 102 includes inverters G11-G18, NOR gates G19 and G20, inverter circuits INV3 and INV4, and a latch circuit LT2.

When the internal signals /CASI and /WI go to "L", the output of inverter G11 goes to "L", and the output of NOR gate G20 is maintained at "H" for a predetermined time period. Thereby, the inverter circuit INV3 is activated, and the inverter circuit INV4 is maintained at the active state for the predetermined time period. Therefore, the data at external data input terminal WIOi is fetched through the inverter circuit INV3, inverter G18 and inverter circuit INV4 to the latch circuit LT2. The latch circuit LT2 latches the data and outputs the same as the write data DBi FIG. 26 is a circuit diagram showing a specific construction of the IO buffer circuit 103 shown in FIG. 23. The IO buffer circuit 103 includes inverters G21 and G22, NAND gates G23 and G24, NOR gates G25 and G26, P-channel MOS transistors P1 and P2, and N-channel MOS transistors N1 and N2.

If the mask information /MSKi is "L" (write inhibit state), the outputs of NAND gates G23 and G24 are "H", and the outputs of NOR gates G25 and G26 are "L". Thereby, the transistors P1, P2, N1 and N2 are turned off. Thus, the write data DBi is not transmitted to the input/output lines IO and /IO.

If the mask information /MSKi is "H" (write enable state), NAND gates G23 and G24 as well as NOR gates G25 and G26 operate as the inverters, respectively. Thus, the write data DBi is transmitted to the input/output line IO, and the inverted data of write data DBi is transmitted to the input/output line /IO.

Referring to a timing chart of FIG. 27, the write per bit operation in page mode of the conventional semiconductor memory device shown in FIGS. 22–26 will be described below.

In response to the fall of the external row address strobe signal /RAS, the external address signal Add is fetched as a row address signal X. Thereby, one row in each memory array block is selected. If the external data write control signal /W is "L" when the external row address strobe signal /RAS falls, the data at external data input terminals WIO0–WIO3 is fetched as mask information /MSK0–/MSK3.

In an example shown in FIG. 27, the mask information MSK0 and /MSK2 goes to "L" (write inhibit state), and the mask information /MSK1 and /MSK3 goes to "H" (write enable state). Thereby, the external data input terminals WIO0 and WIO2 are maintained at the write inhibit state, and the external data input terminals WIO1 and WIO3 are maintained at the write enable state.

While maintaining the external row address strobe signal /RAS at "L", the external column address strobe signal /CAS is repetitively fallen to "L". In response to the fall of the external column address strobe signal /CAS, the external address signals Add are sequentially fetched as column address signals Y1, Y2, Y3 and Y4. Thereby, in each memory array block, the memory arrays on one row selected by the row address signal X are sequentially selected by the column address signals Y1, Y2, Y3 and Y4, respectively. The column selecting operation, which is responsive to the fall of the external column address strobe signal /CAS, is called a CAS cycle.

In a CAS cycle T1, the writing of data D01 at external data input terminal WIO0 and the data D21 at external data input terminal WIO2 is inhibited, and the writing of data D11 at external data input terminal WIO1 and data D31 at external data input terminal WIO3 is carried out. Similarly, in each of CAS cycles T2, T3 and T4, the writing of data at external data input terminals WIO0 and WIO2 is inhibited, and the writing of data at external data input terminals WIO1 and WIO3 is carried out.

As described above, according to the write per bit operation in page mode of the conventional semiconductor memory device shown in FIGS. 22–26, the mask information was fetched when the external row address strobe signal /RAS fell, and in every CAS cycle thereafter, the write inhibit state or write enable state of each external data input terminal is determined, depending on the fetched mask information. Thus, the mask information, which was fetched when the external row address strobe signal /RAS fell, affects every CAS cycle thereafter, so that the mask information in each cycle has no arbitrariness.

SUMMARY OF THE INVENTION

An object of the invention is to give arbitrariness to a mask operation for each CAS cycle in a write per bit operation in page mode of a semiconductor memory device.

Another object of the invention is to give arbitrariness to a mask operation for each CAS cycle in a write per bit operation in page mode without increasing the number of external terminals.

A semiconductor memory device according to the invention includes a plurality of memory arrays, a row selecting circuit, a column selecting circuit, a control circuit, a plurality of input circuits, an inhibition circuit and an activation circuit.

Each of the memory arrays includes a plurality of memory cells disposed in plural rows and plural columns. The row selecting circuit selects one arbitrary row in each of the plurality of memory arrays. The column selecting circuit selects one arbitrary column in each of the plurality of memory arrays. The control circuit makes the column selecting circuit to repetitively carry out the column selecting operation while maintaining the state in which the row selecting circuit selects one row in each of the plurality of memory arrays, to carry out an operation of sequentially selecting memory cells in the selected one row.

The plurality of input circuits are disposed correspondingly to the plurality of memory arrays, and each supplies externally applied data to the memory cells selected by the row selecting circuit and the column selecting circuit in the corresponding memory array. The inhibition circuit inhibits the input of data by the arbitrary input circuit. The activation circuit activates or deactivates the inhibition circuit for each column selecting operation by the column selecting circuit in the operation of sequentially selecting the memory cells in the selected one row.

In the write per bit operation in page mode of the above semiconductor memory device, the inhibition circuit is activated or deactivated for each CAS cycle. If the inhibition circuit is activated, the writing of an arbitrary bit of the externally applied data is inhibited. If the inhibition circuit is deactivated, the writing of all bits of the externally applied data is allowed.

Therefore, in the write per bit operation in page mode, arbitrariness is given to the mask operation for each CAS cycle.

The semiconductor memory device may further include a control terminal for receiving a predetermined control signal. The activation circuit may be responsive to this predetermined control signal to activate or deactivate the inhibition circuit.

The column selecting circuit is responsive to the column selection control signal to carry out the column selecting operation. The plurality of input circuits are responsive to the write control signal to carry out the input operation. The activation circuit may be responsive to the write control signal, which is obtained when the column selection control signal changes, to activate or deactivate the inhibition circuit.

In this case, it is not necessary to add a control terminal for activating or deactivating the inhibition circuit, and thus the number of pins in the semiconductor memory device does not increase.

BRIEF DESCRIPTION OF THE DRAWINGS

FIG. 5 is a diagram showing a truth table of the mask information generating circuit in FIG. 4;

FIG. 10 is diagram showing a truth table of the mask information generating circuit in FIG. 9;

FIG. 16 is a diagram showing a truth table of the mask information generating circuit in FIG. 15;

FIG. 20 is a diagram showing a truth table of the mask information generating circuit in FIG. 19;

DESCRIPTION OF THE PREFERRED EMBODIMENT

(1) First Embodiment

Figure 1:
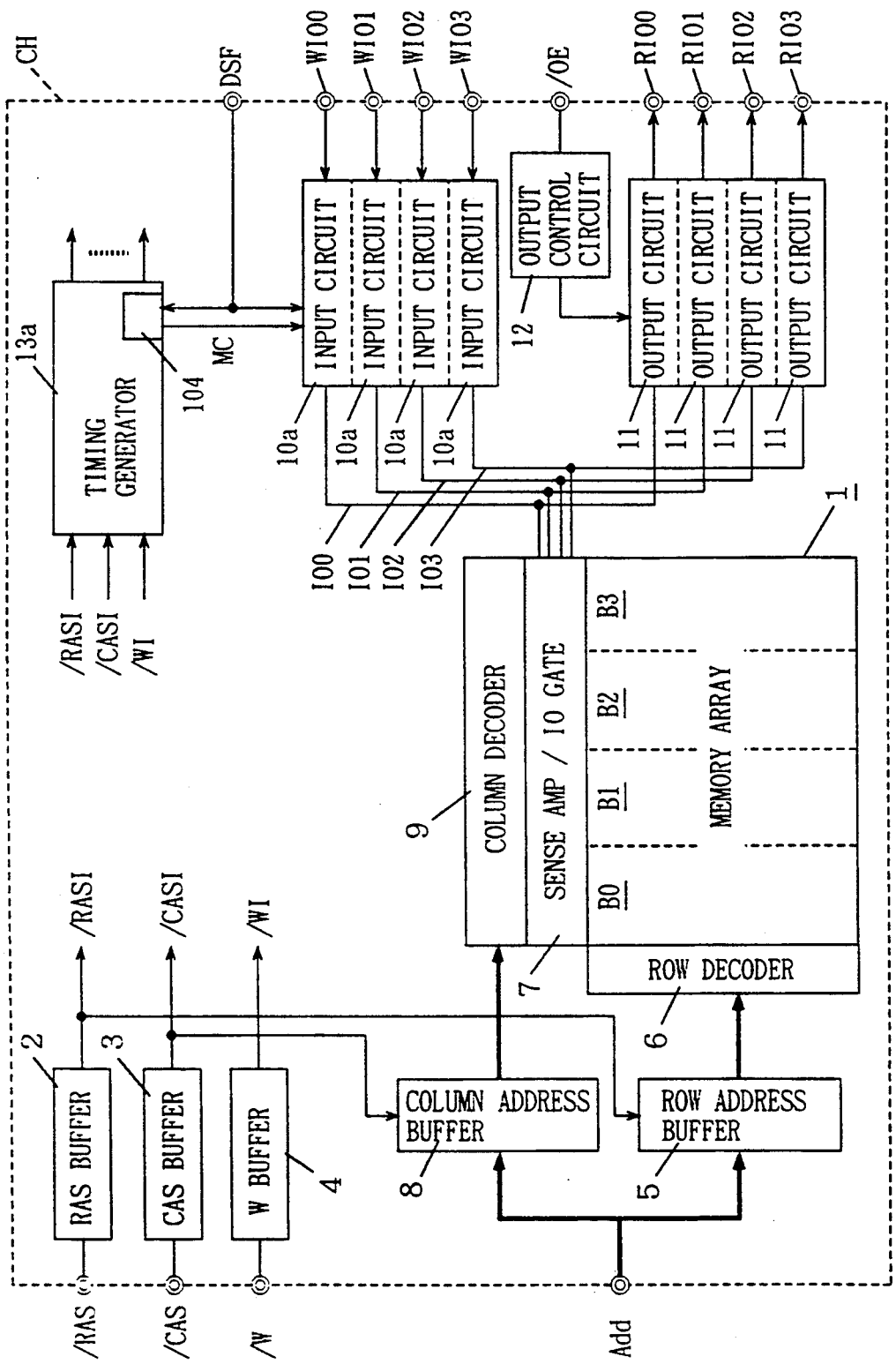
FIG. 1 is a block diagram showing a whole construction of a semiconductor memory device of a first embodiment.
Figure 22:
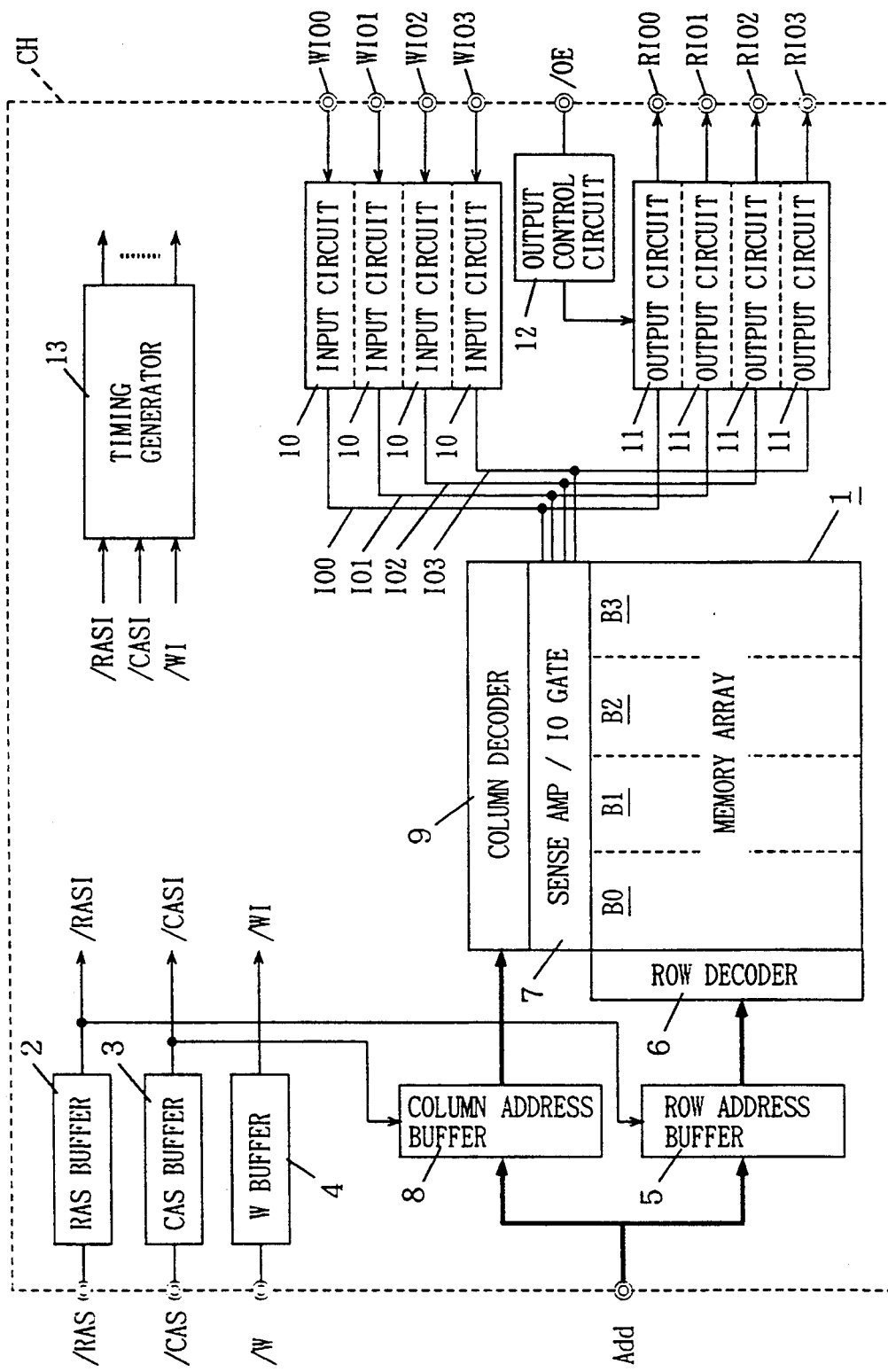
FIG. 22 is a block diagram showing a whole construction of a conventional semiconductor memory device.
Figure 23:
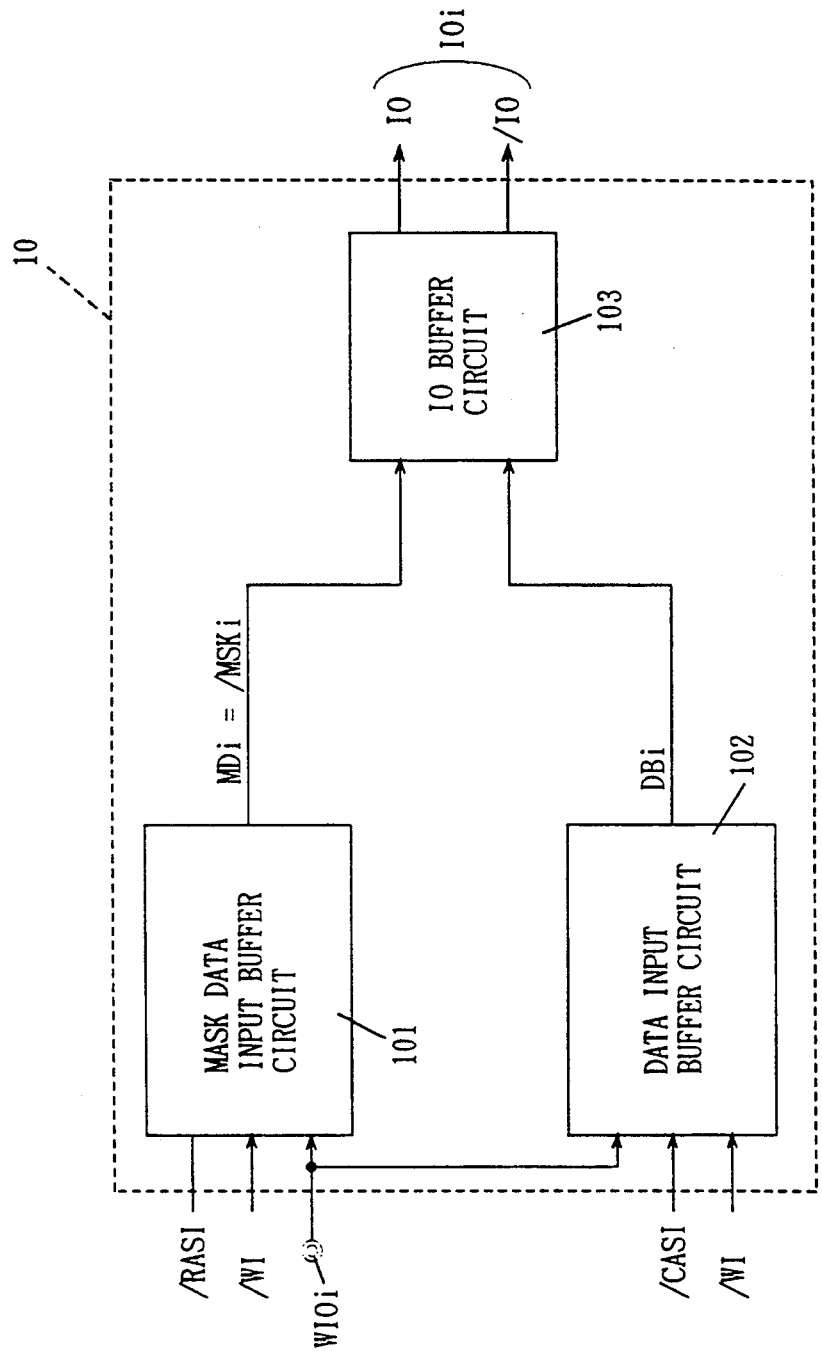
FIG. 23 is a block diagram showing a construction of an input circuit included in the semiconductor memory device in FIG. 22.

FIG. 1 is a block diagram showing a whole construction of a semiconductor memory device of a first embodiment. The semiconductor memory device in FIG. 1 is different from the semiconductor memory device in FIG. 22 in the following points.

There is further provided with, a control signal input terminal for receiving a special function control signal DSF which may provide a bit write control signal. In a timing generator 13a, there is provided a mask control circuit 104 for generating a mask control signal MC in response to the special function control signal DSF. Further, the construction of each input circuit 10a is different from that of the input circuit 10 shown in FIG. 22. The other constructions are similar to those shown in FIG. 22.

Figure 2:
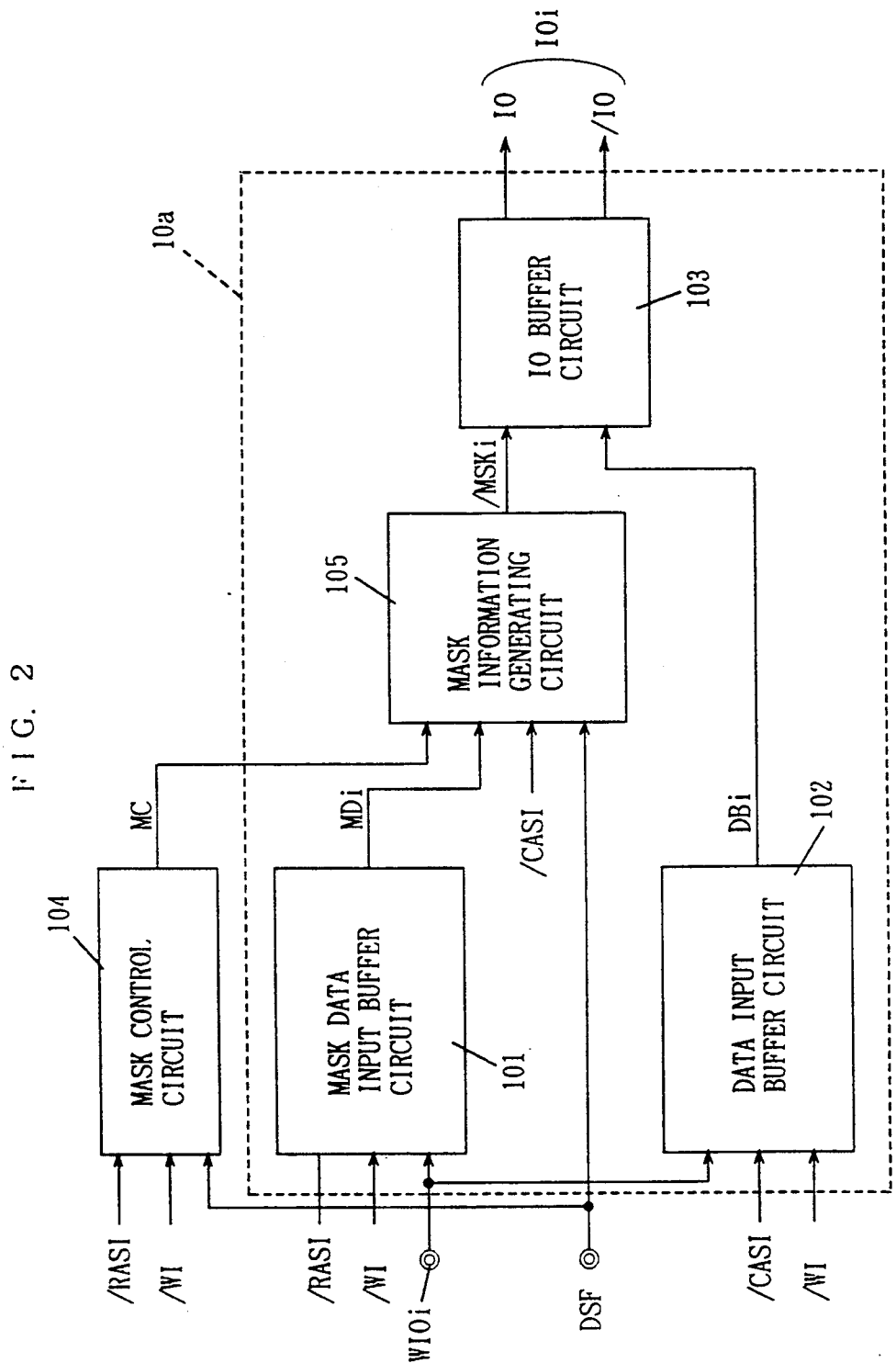
FIG. 2 is a block diagram showing a construction of an input circuit included in a semiconductor memory device of a first embodiment.

FIG. 2 is a block diagram showing a construction of one of the input circuits 10a included in the semiconductor memory device shown in FIG. 1. The input circuit 10a includes a mask data input buffer circuit 101, a data input buffer circuit 102, a mask information generating circuit 105 and an IO buffer circuit 103.

The mask control circuit 104 is disposed commonly to the four input circuits 10a, as shown in FIG. 1.

Figure 24:
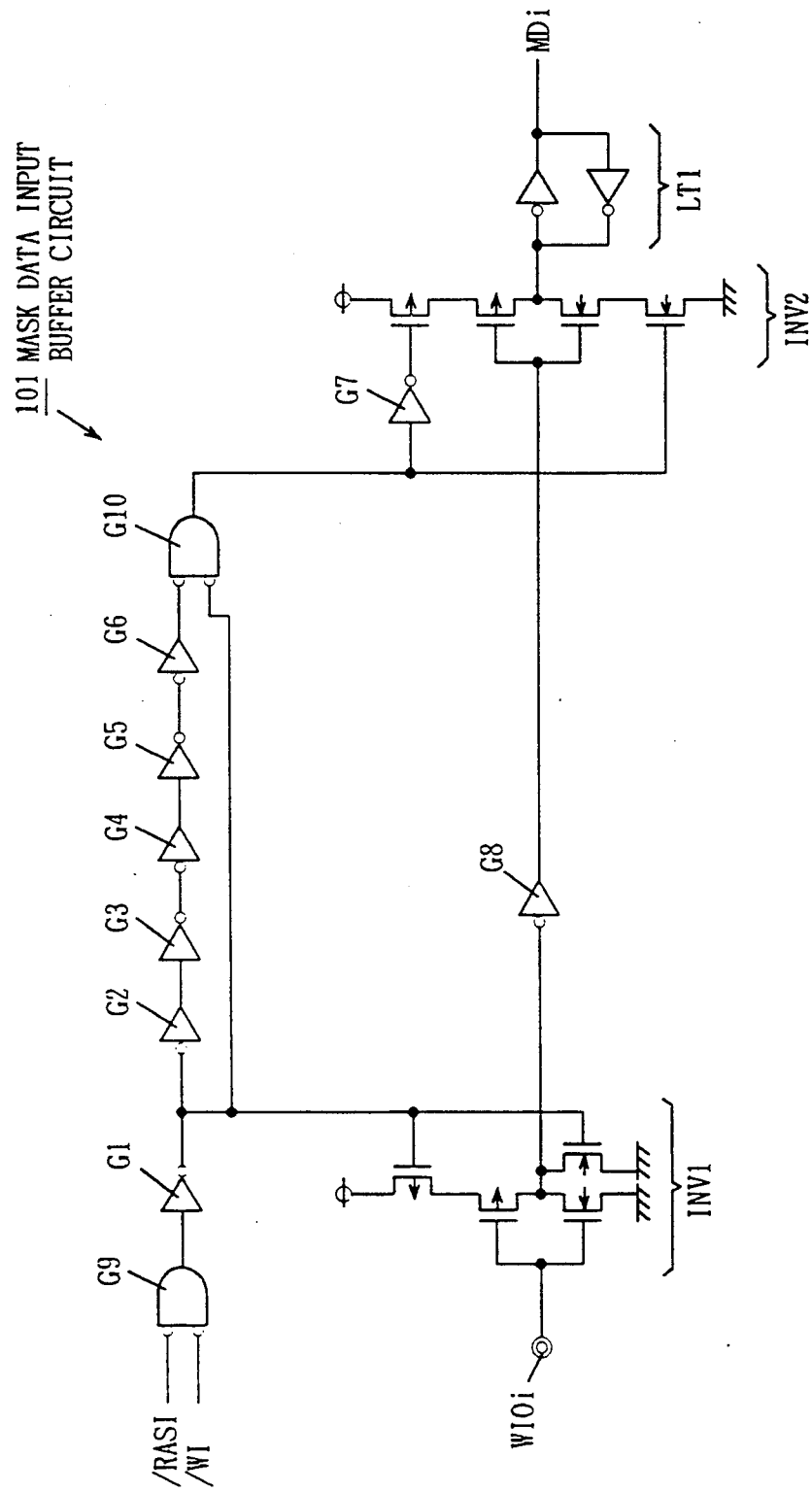
FIG. 24 is a circuit diagram showing a specific construction of a mask data input buffer circuit.
Figure 25:
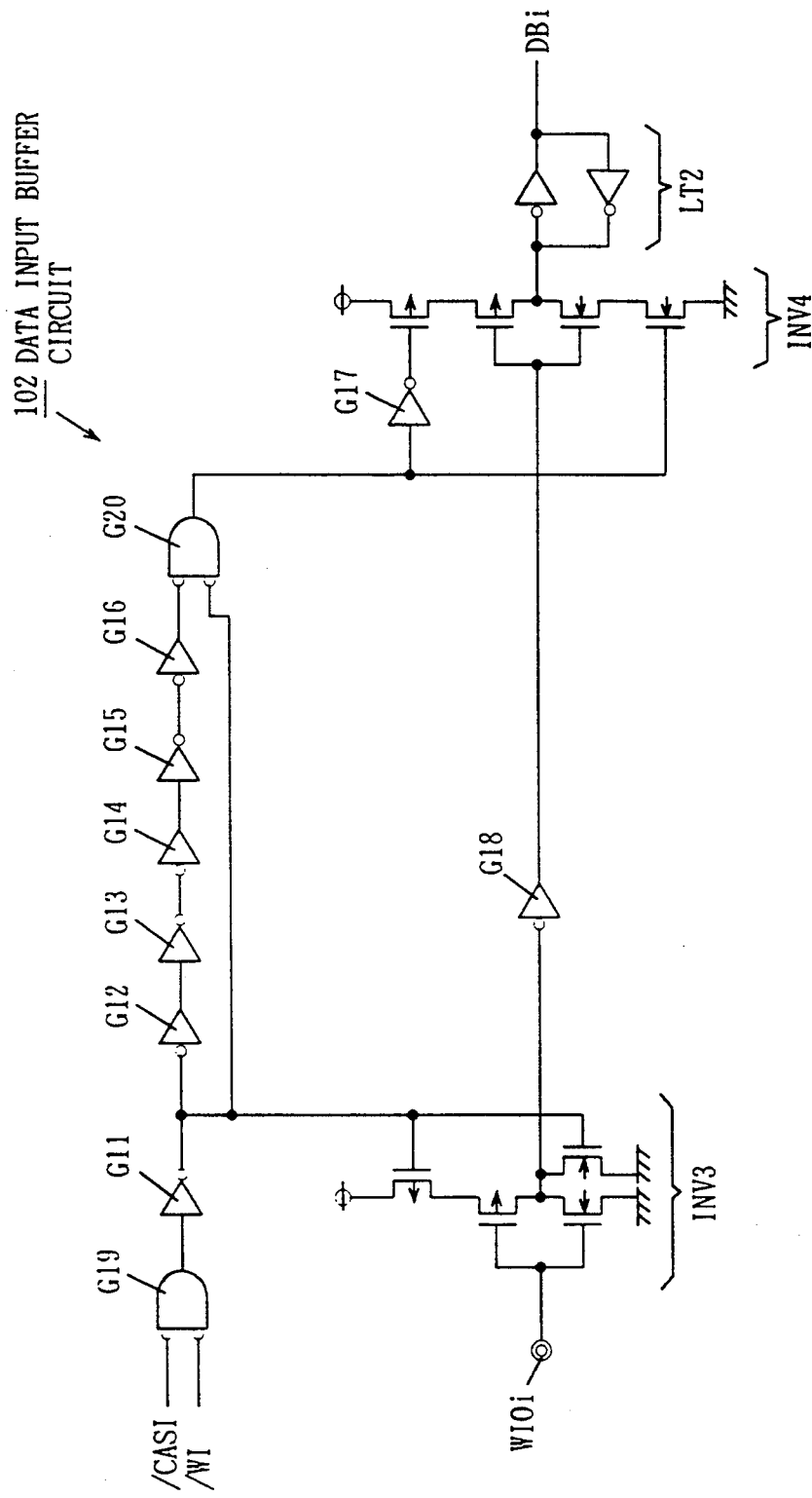
FIG. 25 is a circuit diagram showing a specific construction of a data input buffer circuit.
Figure 26:
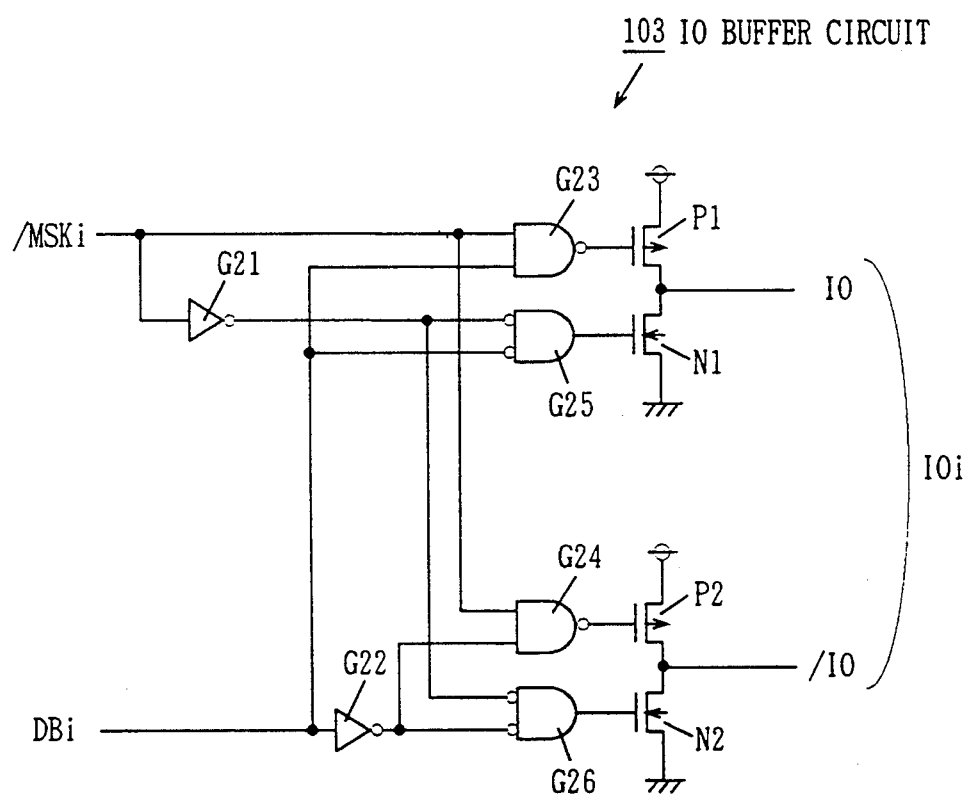
FIG. 26 is a circuit diagram showing a specific construction of an IO buffer circuit.
Figure 27:
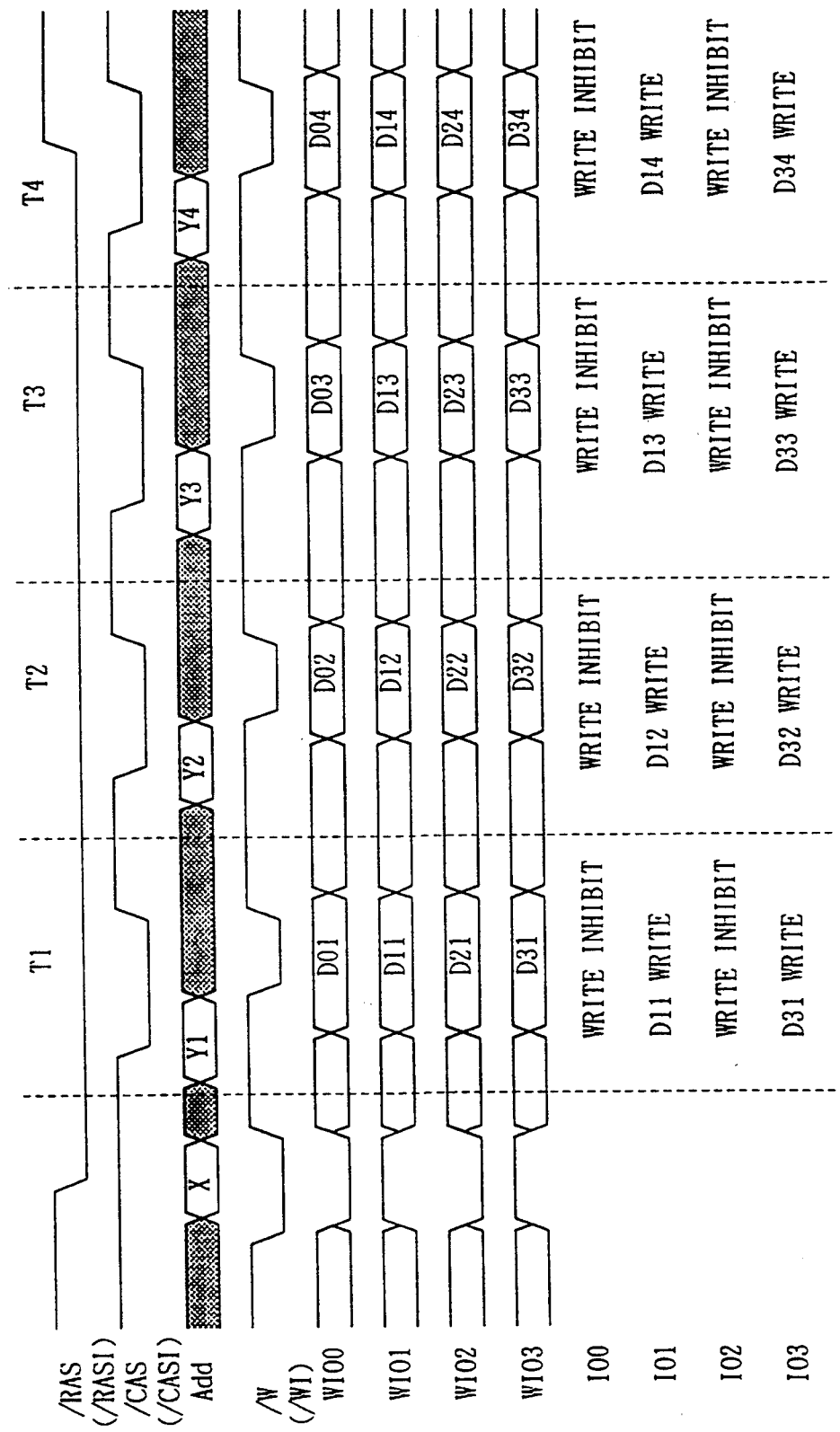
FIG. 27 is a timing chart for showing a write per bit operation in page mode in the semiconductor memory device shown in FIG. 22.

The constructions and operations of the mask data input buffer circuit 101, data input buffer circuit 102 and IO buffer circuit 103 are similar to those of the mask data input buffer circuit 101, data input buffer circuit 102 and IO buffer circuit 103 shown in FIGS. 24, 25 and 26, respectively.

The mask control circuit 104 is responsive to internal signals /RASI and /WI to receive the special function control signal DSF, and generates the mask control signal MC. The mask control signal MC of "H" represents a first mode for carrying out an operation peculiar to the invention, and the mask control signal MC of "L" represents a second mode for carrying out an operation similar to that of the conventional semiconductor memory device.

The mask information generating circuit 105 generates the mask information /MSKi in response to internal signal /CASI, mask control signal MC, mask data MDi and special function control signal DSF.

Figure 3:
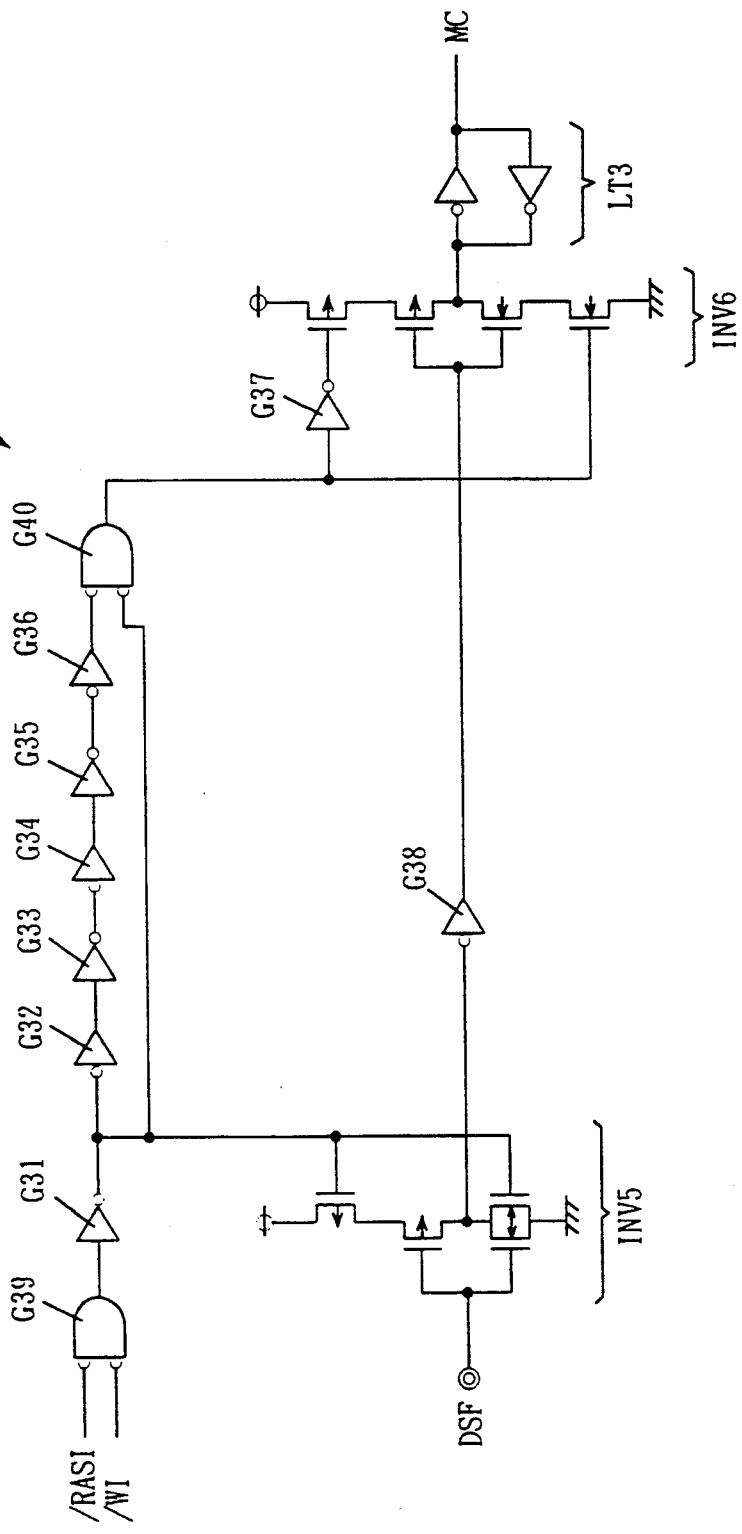
FIG. 3 is a circuit diagram showing a specific construction of a mask control circuit included in the input circuit in FIG. 2.

FIG. 3 is a circuit diagram showing a specific construction of the mask control circuit 104 shown in FIG. 2. The mask control circuit 104 includes inverters G31-G38, NOR gates G39 and G40, inverter circuits INV5 and INV6, and a latch circuit LT3.

When the internal signals /RASI and /WI go to "L", the output of inverter G31 goes to "L", and the output of NOR gate G40 is maintained at "H" for a predetermined time period. Thereby, the inverter circuit INV5 is activated, and the inverter circuit INV6 is activated for the predetermined time period. Therefore, the special function control signal DSF is fetched through the inverter circuit INV5, the inverter G38 and inverter circuit INV6 to the latch circuit LT3. The latch circuit LT3 latches the special function control signal DSF and outputs it as the mask control signal MC.

If the special function control signal DSF is "H" when the internal signal /RASI falls, the mask control signal MC is "H". If the special function control signal DSF is "L" when the internal signal /RASI falls, the mask control signal MC is "L".

Figure 4:
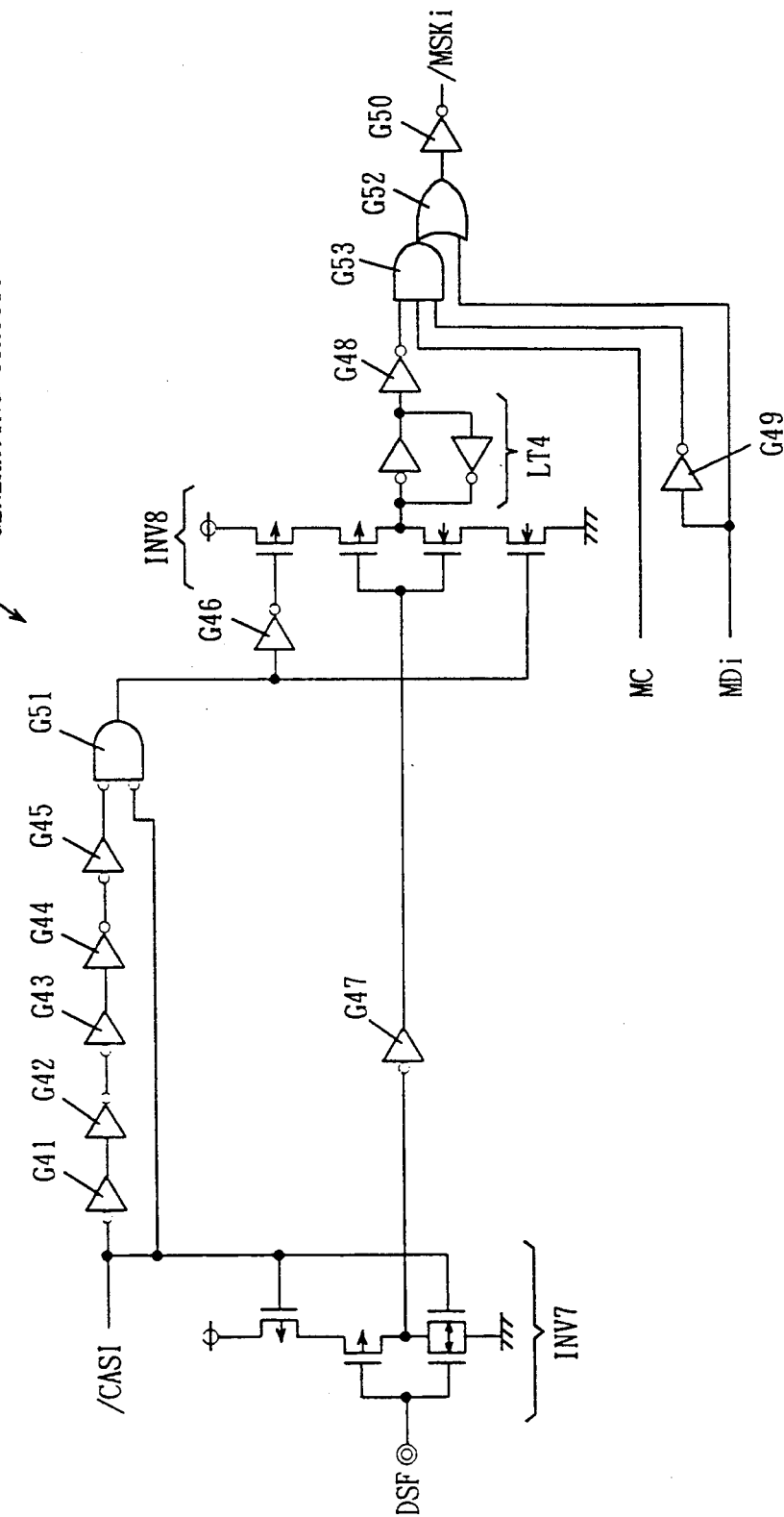
FIG. 4 is a circuit diagram showing a specific construction of a mask information generating circuit included in the input circuit in FIG. 2.

FIG. 4 is a circuit diagram showing a specific construction of the mask information generating circuit 105 shown in FIG. 2. The mask information generating circuit 105 includes inverters G41-G50, NOR gates G51 and G52, an AND gate G53, inverter circuits INV7 and INV8, and a latch circuit LT4.

When the internal signal /CASI falls to "L", the inverter circuit INV7 is activated. Also, the output of NOR gate G51 is maintained at "H" for a predetermined time period. Thereby, the inverter circuit INV8 is activated for the predetermined time period. Therefore, the special function control signal DSF is fetched through the inverter circuit INV7, inverter G47 and inverter circuit INV8 to the latch circuit LT4. The latch circuit LT4 latches the special function control signal DSF and outputs the same.

The inverters G48, G49 and G50, AND gate G53 and NOR gate G52 carry out a logic operation for the special function control signal DSF held by the latch circuit LT4, mask control signal MC applied from the mask control circuit 104 and mask data MDi applied from the mask data input buffer circuit 101, whereby the mask information /MSKi is generated.

FIG. 5 shows a truth table of the mask information generating circuit 104 in FIG. 4.

If the special function control signal DSF is "H" when the mask control signal MC is "H", i.e., at the fall of the internal signal /RASI, the input circuit 10a is set at the first mode for carrying out the operation peculiar to the invention. In this case, the mask information /MSKi is determined, depending on the state of the special function control signal DSF in each CAS cycle.

In each CAS cycle, if the special function control signal DSF is "H", the mask information /MSKi is equal to the mask data MDi. Specifically, if the mask data MDi is H", the mask information /MSKi is "H" (write enable state). If the mask data MDi is "L", the mask information /MSKi is "L" (write inhibit state). In each CAS cycle, if the special function control signal DSF is "L", the mask information /MSKi is "H" (write enable state). Therefore, the writing of data is carried out.

If the special function control signal DSF is "L" when the mask control signal MC is "L", i.e., at the fall of the internal signal /RASI, the input circuit 10a is set in a second mode for carrying out an operation similar to that of the conventional semiconductor memory device. In this case, the mask information /MSKi is equal to the mask data MDi at the fall of the internal signal /RASI, regardless of the state of the special function control signal DSF in each CAS cycle.

Figure 6:
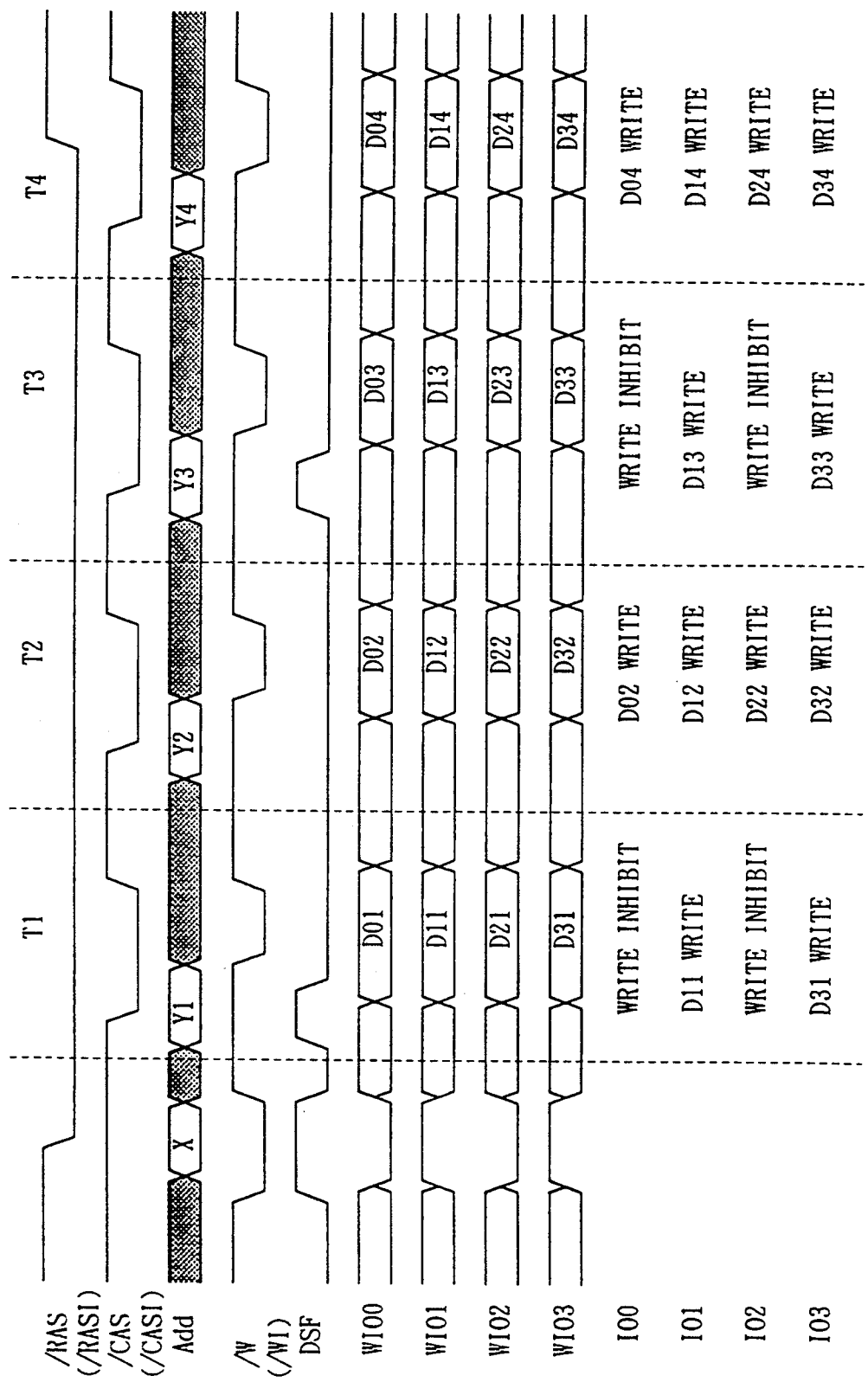
FIG. 6 is a timing chart showing a write per bit operation in page mode in a semiconductor memory device of the first embodiment.

Referring to a timing chart of FIG. 6, the write per bit operation in page mode in the semiconductor memory device of the first embodiment will be described below.

If the external data write control signal /W is "L" and the special function control signal DSF is "H" when the external row address strobe signal /RAS falls, the mask control signal MC is "H", and the input circuit 10a is set at the first mode.

In response to the fall of the external row address strobe signal /RAS, the data at external data input terminals WIO0-WIO3 is fetched as the mask data MD0-MD3. In the example in FIG. 6, the mask data MD0 and MD2 is "L" (write inhibit state), and the mask data MD1 and MD3 is "H" (write enable state).

In each of the CAS cycles T1 and T3, the special function control signal DSF is "H" when the external column address strobe signal /CAS falls. In this case, the mask information /MSK0-/MSK3 is equal to the mask data MD0-MD3, respectively. Therefore, the mask information /MSK0 and /MSK2 is "L" (write inhibit state), and the mask information /MSK1 and /MSK3 is "H" (write enable state). As a result, the data at external data input terminals WIO0 and WOI2 is not transmitted to the input/output lines IO0 and IO2, and the data at external data input terminals WIO1 and WIO3 is transmitted to the input lines IO1 and IO3 and is written in the memory array blocks B1 and B3, respectively.

In each of the CAS cycles T2 and T4, the special function control signal DSF is "L" when the external column address strobe signal /CAS falls. In this case, mask information /MSK0-/MSK3 is "H" (write enable state). As a result, the data at external data input terminals WIO0-WIO3 is transmitted to the input/output lines IO0-IO3 and is written in the memory array blocks B0-B3.

As described above, the mask information is controlled in each CAS cycle, depending on the state of the special function control signal DSF at the fall of the external column address strobe signal /CAS.

(2) Second Embodiment

Figure 7:
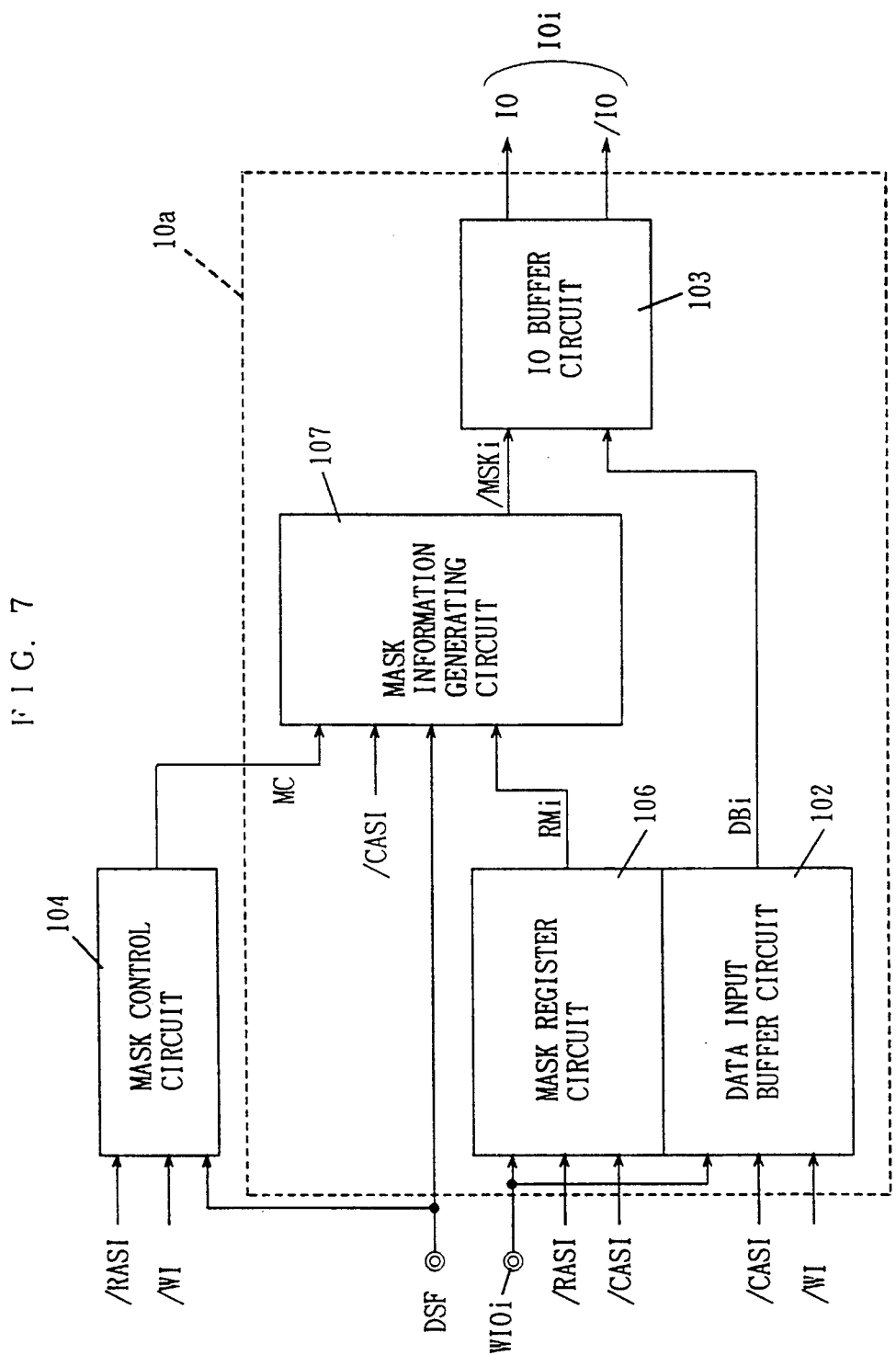
FIG. 7 is a block diagram showing a construction of an input circuit included in a semiconductor memory device of a second embodiment.

FIG. 7 is a block diagram showing a construction of one of input circuits 10a included in a semiconductor memory device of a second embodiment. The whole construction of the semiconductor memory device of the second embodiment is similar to that shown in FIG. 1.

The input circuit 10a includes a mask register circuit 106, a data input buffer circuit 102, a mask information generating circuit 107 and an IO buffer circuit 103. A mask control circuit 104 is disposed commonly to the four input circuits 10a, as shown in FIG. 1. The construction and operation of the data input buffer circuit 102 and IO buffer circuit 103 are similar to those of the data input buffer circuit 102 and IO buffer circuit 103 shown in FIGS. 25 and 26. The construction and operation of the mask control circuit 104 are similar to those of the mask control circuit 104 shown in FIG. 3.

The mask register circuit 106 is responsive to the internal signals /RASI and /CASI to receive the data at external data input terminal WIOi, and generates the mask register information RMi.

The mask information generating circuit 107 generates the mask information /MSKi in response to the internal signal /CASI, the mask control signal MC sent from the mask control circuit 104, the special function control signal DSF and the mask register information RMi sent from the mask register circuit 106.

Figure 8:
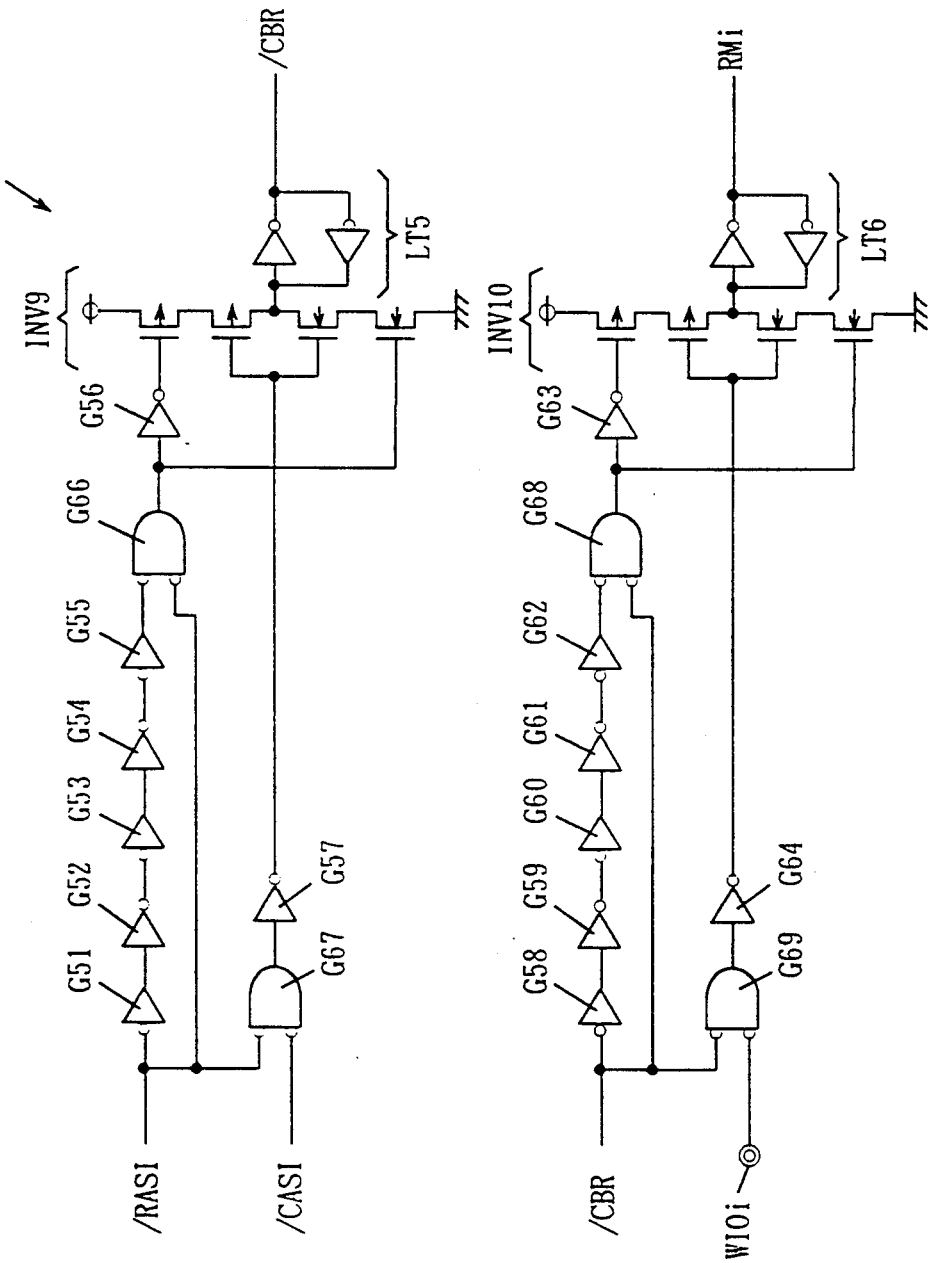
FIG. 8 is a circuit diagram showing a specific construction of a mask register circuit included in the input circuit in FIG. 7.

FIG. 8 is a circuit diagram showing a specific construction of the mask register circuit 106 shown in FIG. 7. The mask register circuit 106 includes inverters G51-G64, NOR gates G66-G69, inverter circuits INV9 and INV10, and latch circuits LT5 and LT6.

A detection signal /CBR goes to "L", if the internal signal /CASI is already "L" when the internal signal /RASI falls. Thereby, the /CAS before /RAS cycle, in which the external column address strobe signal /CAS is already "L" when the external row address strobe signal /RAS falls, is detected.

When the detection signal /CBR goes to "L", the inverter circuit INV10 is activated for a predetermined time period. Thereby, the data at external data input terminal WIOi is fetched through the NOR gate G69, inverter G64 and inverter circuit INV10 to the latch circuit LT6. The latch circuit LT6 latches the fetched data and outputs it as the mask register information RMi.

Figure 9:
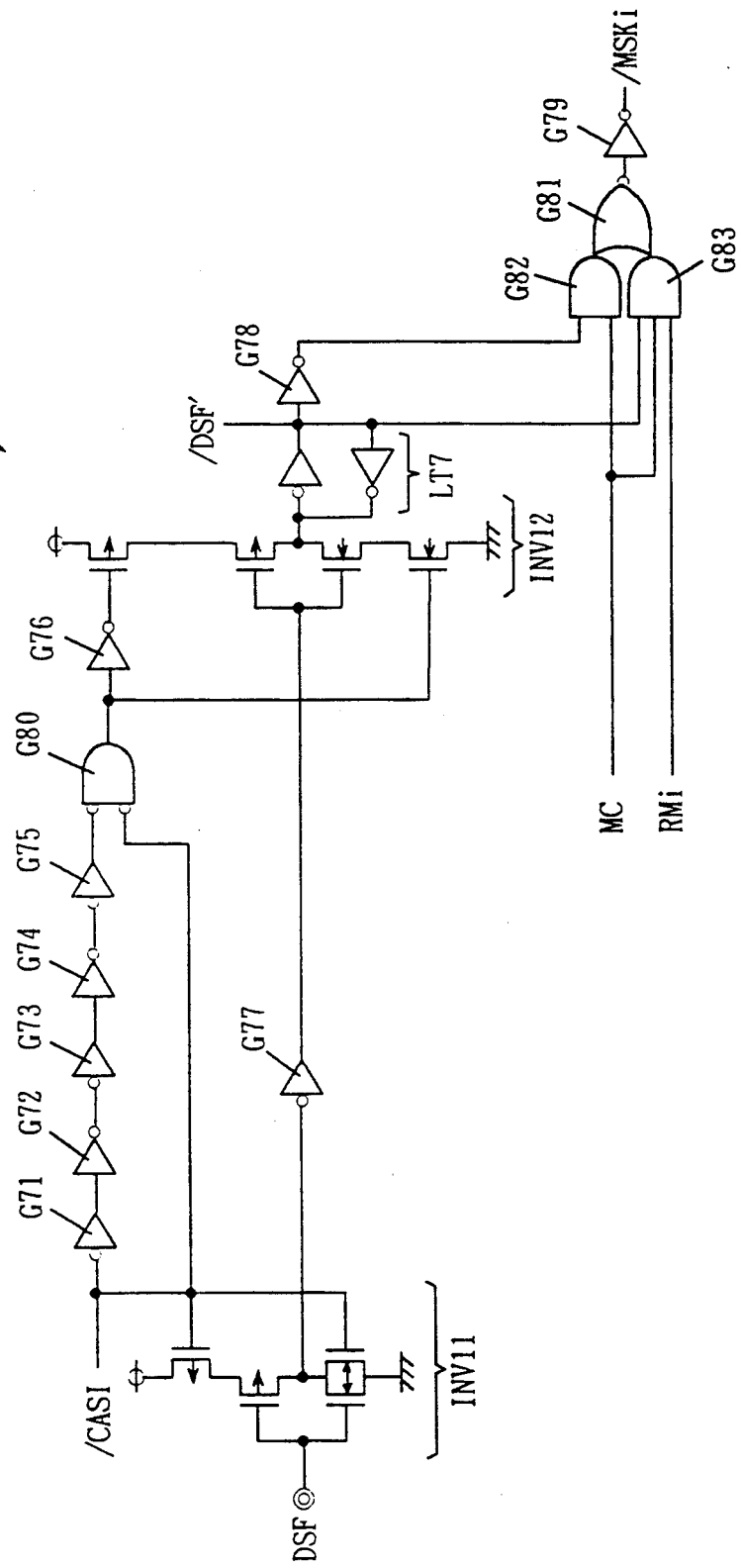
FIG. 9 is a circuit diagram showing a specific construction of a mask information generating circuit included in the input circuit in FIG. 7.

FIG. 9 is a circuit diagram showing a specific construction of the mask information generating circuit 107 shown in FIG. 7. The mask information generating circuit 107 includes inverters G71-G79, NOR gates G80 and G81, AND gates G82 and G83, inverter circuits INV11 and INV12, and a latch circuit LT7.

When the internal signal /CASI goes to "L", the inverter circuit INV11 is activated. Also, the output of NOR gate G80 is maintained at "H" for a predetermined time period, and the inverter circuit INV12 is activated for the predetermined time period. Therefore, the special function control signal DSF is fetched through the inverter circuit INV11, inverter G77 and inverter circuit INV12 to the latch circuit LT7. The latch circuit LT7 latches the special function control signal DSF and outputs it as a special function control signal /DSF'.

The inverters G78 and G79, AND gates G82 and G83, and NOR gate G81 carry out the logic operation for the special function control signal /DSF' held by the latch circuit LT7, the mask control signal MC sent from the mask control circuit 104, and the mask register information RMi sent from the mask register circuit 106, whereby the mask information /MSKi is generated.

FIG. 10 shows a truth table of the mask information generating circuit 107 in FIG. 9.

If the special function control signal DSF is "H" when the mask control signal MC is "H", i.e., at the fall of the internal signal /RASI, the input circuit 10a is set at the first mode for carrying out the operation peculiar to the invention. In this case, the mask information /MSKi is determined, depending on the state of the special function control signal DSF in each CAS cycle.

In each CAS cycle, if the special function control signal DSF is "H", the mask information /MSKi is equal to the mask register information RMi. Specifically, if the mask register information RMi is "H", the mask information /MSKi is "H" (write enable state). If the mask register information RMi is "L", the mask information /MSKi is "L" (write inhibit state). In each CAS cycle, if the special function control signal DSF is "L", the mask information /MSKi is "H" (write enable state), and the writing of data is carried out.

If the special function control signal DSF is "L" when the mask control signal MC is "L", i.e., at the fall of the internal signal /RASI, the input circuit 10a is set at the second mode for carrying out the operation similar to that of the conventional semiconductor memory device. In this case, the mask information /MSKi is equal to the mask register information RMi determined at the fall of the internal signal /RASI, regardless of the state of the special function control signal DSF in each CAS cycle.

Then, the write per bit operation in page mode of the semiconductor memory device of the second embodiment will be described below with reference to timing charts of FIGS. 11 and 12.

Figure 11:
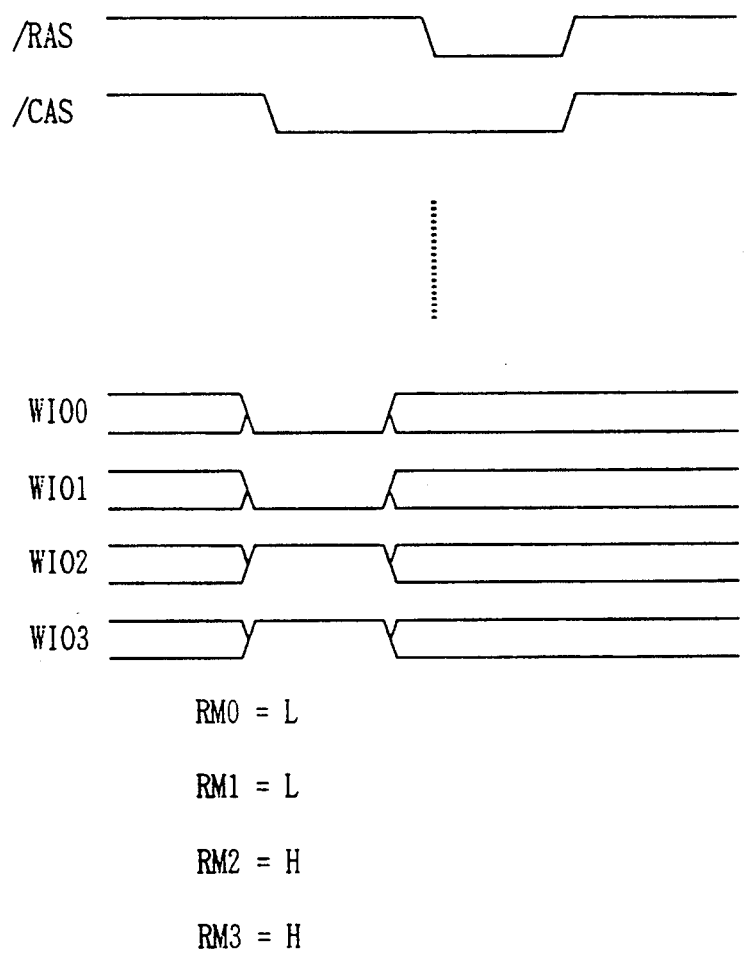
FIG. 11 is a timing chart showing a /CAS before /RAS cycle.

In the write per bit operation in page mode, as shown in FIG. 11, the data at external data input terminals WIO0-WIO3 has been held by the mask register circuit 106 as the mask register information RM0-RM3 in the /CAS before /RAS cycle, respectively. In the example in FIG. 11, the mask register information RM0 and RM1 is set at "L", and the mask register information RM2 and RM3 is set at "H".

Figure 12:
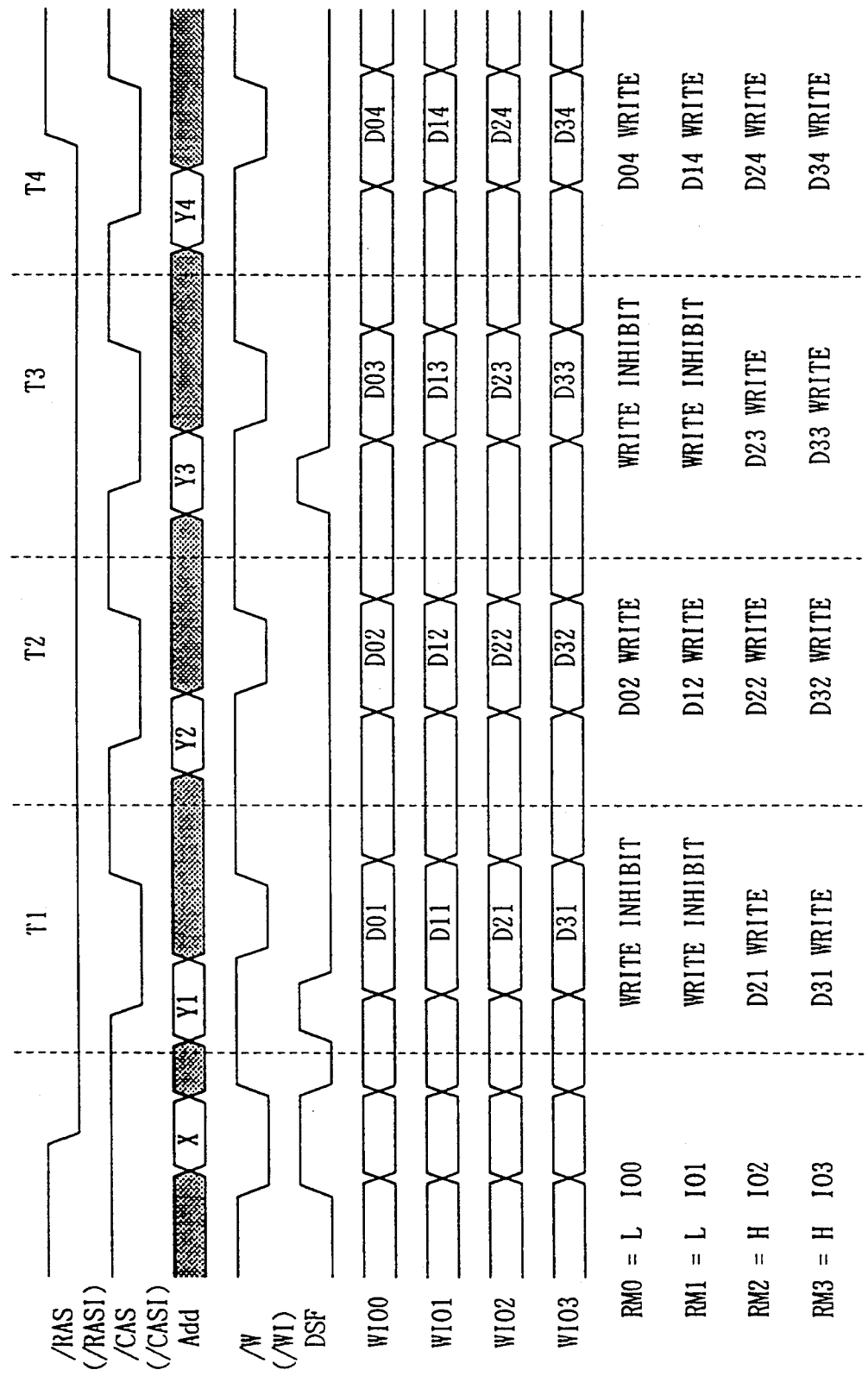
FIG. 12 is a timing chart showing a write per bit operation in page mode in the semiconductor memory device of the second embodiment.

As shown in FIG. 12, if the external data write control signal /W is "L" and the special function control signal DSF is "H" when the external row address strobe signal /RAS falls, each input circuit 10a is set at the first mode.

In each of the CAS cycles T1 and T3, the special function control DSF is "H" when the external column address strobe signal /CAS falls. In this case, the mask information /MSK0-/MSK3 is equal to the mask register information RM0-RM3. Therefore, the mask information /MSK0 and /MSK1 is "L" (write inhibit state), and the mask information /MSK2 and /MSK3 is "H" (write enable state). As a result, the data at external data input terminals WIO0 and WIO1 is not transmitted to the input/output lines IO0 and IO1, and the data at external data input terminals WIO2 and WIO3 is transmitted to the input/output lines IO2 and IO3 and is written in the memory array blocks B2 and B3, respectively.

In each of the CAS cycles T2 and T4, the special function control signal DSF is "L" when the external column address strobe signal /CAS falls. In this case, the mask information /MSK0-/MSK3 is "H" (write enable state). As a result, the data at external data input terminals WIO0-WIO3 is transmitted to the input/output lines IO0-IO3 and is written in the memory array blocks B0-B3, respectively.

In this manner, the mask information is controlled in each CAS cycle, depending on the state of the special function control signal DSF at the fall of the external column address strobe signal /CAS.

(3) Third Embodiment

Figure 13:
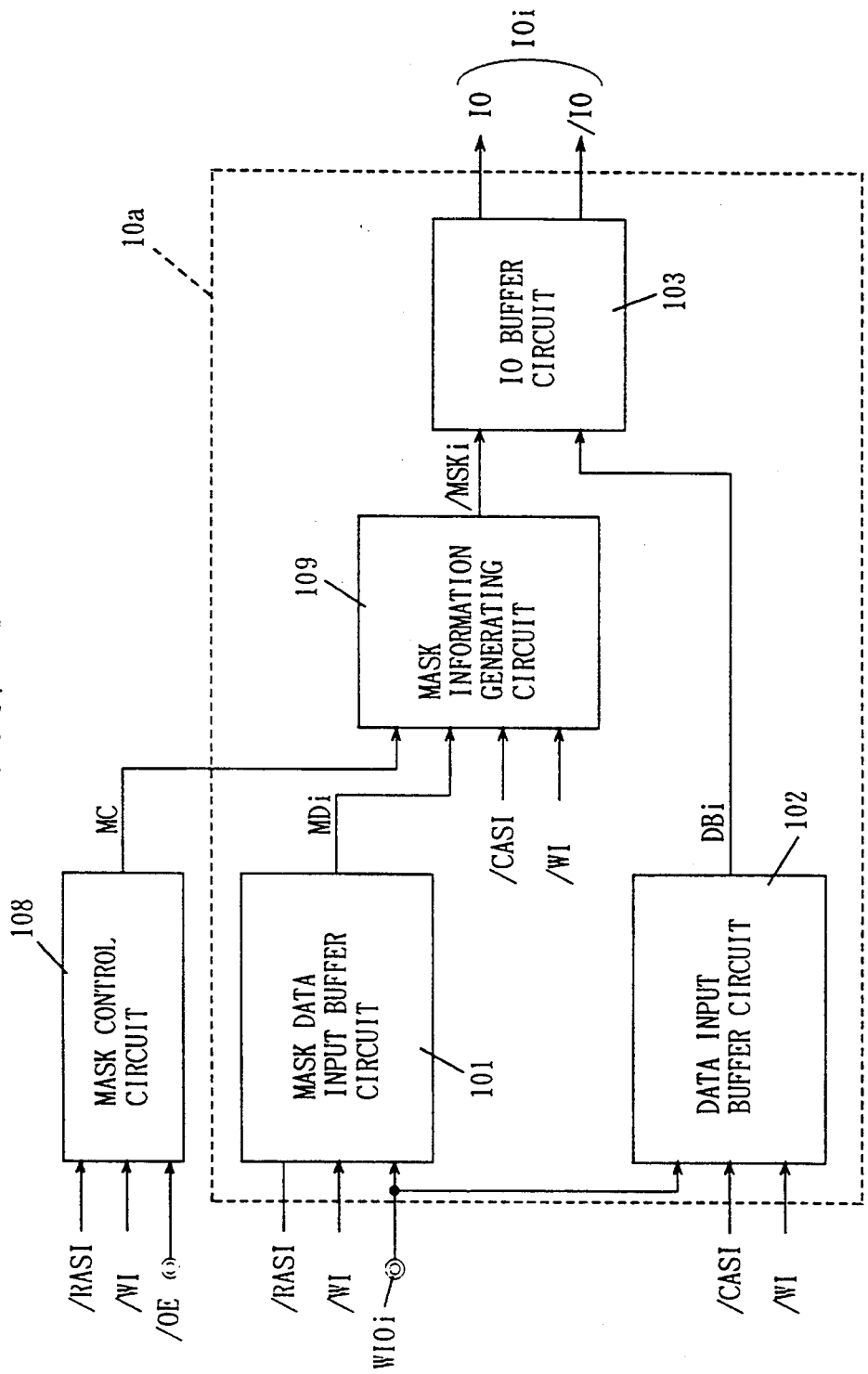
FIG. 13 is a block diagram showing a construction of an input circuit included in a semiconductor memory device of a third embodiment.

FIG. 13 is a block diagram showing a construction of one of input circuits 10a included in a semiconductor memory device of the third embodiment. The whole construction of this semiconductor memory device is similar to that shown in FIG. 1, except for the following points.

There is not provided a control terminal for receiving the special function control signal DSF. Instead of the mask control circuit 104 for generating the mask control signal MC in response to the special function control signal DSF, there is provided a mask control circuit 108 (FIG. 14) for generating the mask control signal MC in response to the external output enable signal /OE.

In FIG. 13, the input circuit 10a includes a mask data input buffer circuit 101, a data input buffer circuit 102, a mask information generating circuit 109 and an IO buffer circuit 103. The construction and operation of the mask data input buffer circuit 101, data input buffer circuit 102 and IO buffer circuit 103 are similar to those of the mask data input buffer circuit 101, data input buffer circuit 102 and IO buffer circuit 103 shown in FIGS. 24, 25 and 26, respectively.

The mask control circuit 108 is responsive to the internal signals /RASI and /WI to receive the external output enable signal /OE, and generates the mask control signal MC.

The mask information generating circuit 109 generates the mask information /MSKi in response to the internal signals /CASI and /WI, the mask control signal MC sent from the mask control circuit 108 and the mask data MDi sent from the mask data input buffer circuit 101.

Figure 14:
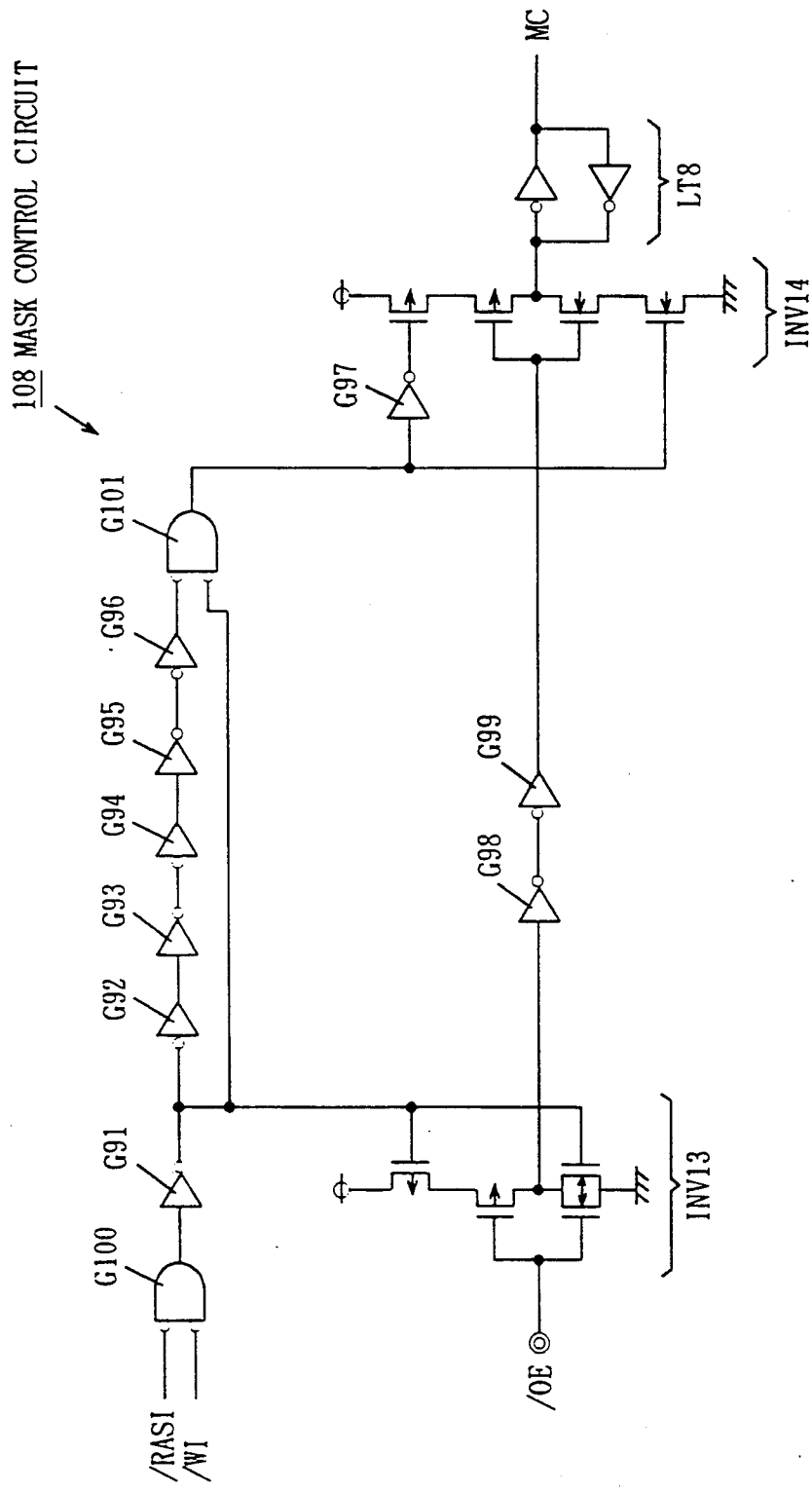
FIG. 14 is a circuit diagram showing a specific construction of a mask control circuit.

FIG. 14 is a circuit diagram showing a specific construction of the mask control circuit 108 shown in FIG. 13. The mask control circuit 108 includes inverters G91–G99, NOR gates G100 and G101, inverter circuits INV13 and INV14, and a latch circuit LT8.

When the internal signals /RASI and /WI go to "L", the output of inverter G91 goes to "L", and the output of NOR gate G101 is maintained at "H" for a predetermined time period. Thereby, the inverter circuit INV13 is activated, and the inverter circuit INV14 is activated for the predetermined time period. Therefore, the external output enable signal /OE is fetched through the inverter circuit INV13, inverters G98 and G99 and inverter circuit INV14 to the latch circuit LT8. The latch circuit LT8 latches the inverted signal of external output enable signal /OE and outputs it as the mask control signal MC.

If the external output enable signal /OE is "L" when the external row address strobe signal /RAS falls, the mask control signal MC goes to "H". If the external output enable signal /OE is "H" when the external row address strobe signal /RAS falls, the mask control signal MC goes to "L".

Figure 15:
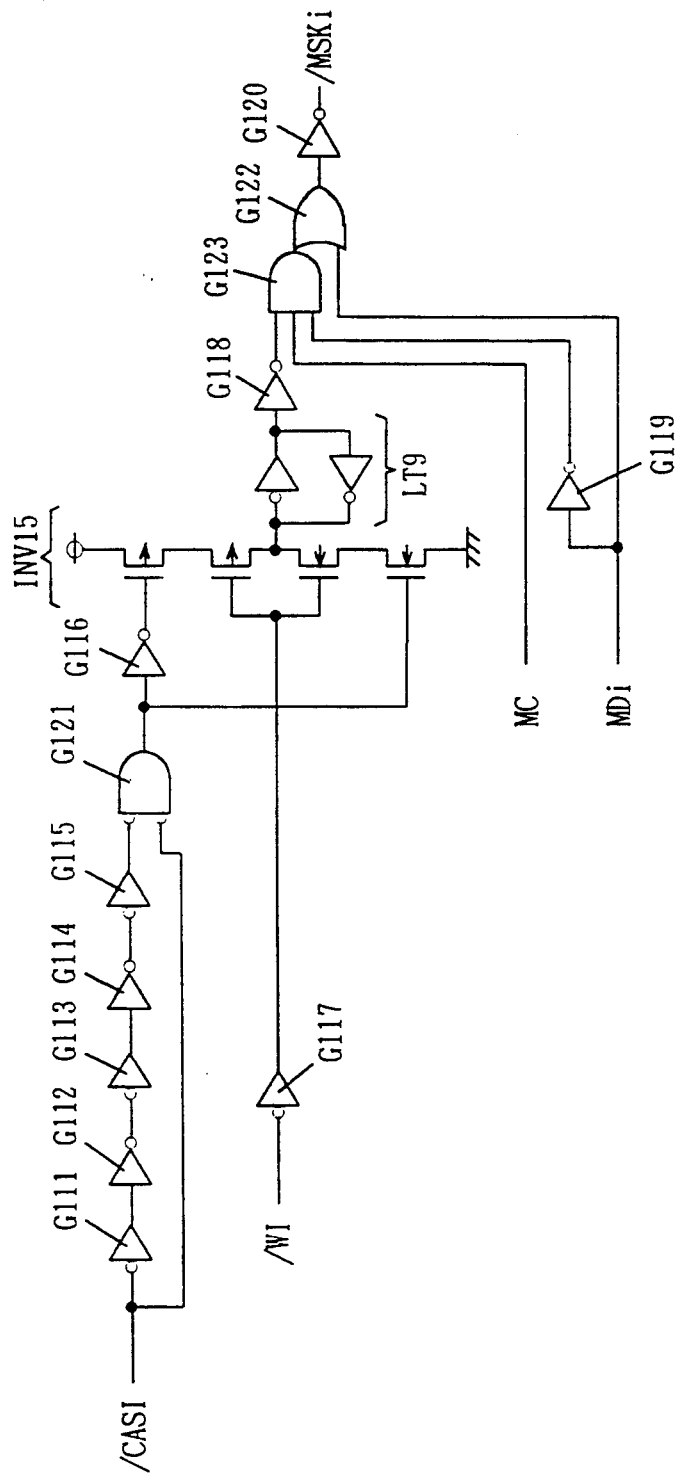
FIG. 15 is a circuit diagram showing a specific construction of a mask information generating circuit included in the input circuit in FIG. 13.

FIG. 15 is a circuit diagram showing a specific construction of the mask information generating circuit 109 in FIG. 13. The mask information generating circuit 109 includes inverters G111–G120, NOR gates G121 and G122, an AND gate G123, an inverter circuit INV15, and a latch circuit LT9.

When the internal signal /CASI falls to "L", the output of NOR gate G121 is maintained at "H" for a predetermined time period. Thereby, the inverter circuit INV15 is activated for a predetermined time period. Therefore, the internal signal /WI is transmitted through the inverter G117 and inverter circuit INV15 to the latch circuit LT9. The latch circuit LT9 latches the inverted signal of internal signal /WI and outputs the same.

The inverters G118–G120, AND gate G123 and NOR gate G122 carry out the logic operation for the signal held by the latch circuit LT9, the mask control signal MC applied from the mask control circuit 108, and the mask data MDi applied from the mask data input buffer circuit 101, and generates the mask information /MSKi.

FIG. 16 shows a truth table of the mask information generating circuit 109 shown in FIG. 15.

If the external output enable signal /OE is "L" when the mask control signal MC is "H", i.e., at the fall of the internal signal /RASI, the input circuit 10a is set at the first mode for carrying out the operation peculiar to the invention. In this case, the mask information /MSKi is determined, depending on whether the external data write control signal /W has already fallen to "L" at the fall of the external column address strobe signal /CAS in each CAS cycle.

If the external data write control signal /W has already fallen to "L" at the fall of the external column address strobe signal /CAS in each CAS cycle, the mask information /MSKi becomes equal to the mask data MDi. In other words, if the mask data MDi is "H", the mask information /MSKi is "H" (write enable state). If the mask data MDi is "L", the mask information /MSKi is "L" (write inhibit state). If the external data write control signal /W is still "H" at the fall of the external column address strobe signal /CAS in each CAS cycle, the mask information /MSKi is "H" (write enable state) and the writing of data is allowed If the external output enable signal /OE is "H" when the mask control signal MC is "L", i.e., at the fall of the internal signal /RASI, the input circuit 10a is set at the second mode for carrying out the operation similar to that of the conventional semiconductor memory device. In this case, the mask information /MSKi is equal to the mask data MDi which is obtained at the fall of the internal signal /RASI, regardless of the state of the external data write control signal /W in each CAS cycle.

Figure 17:
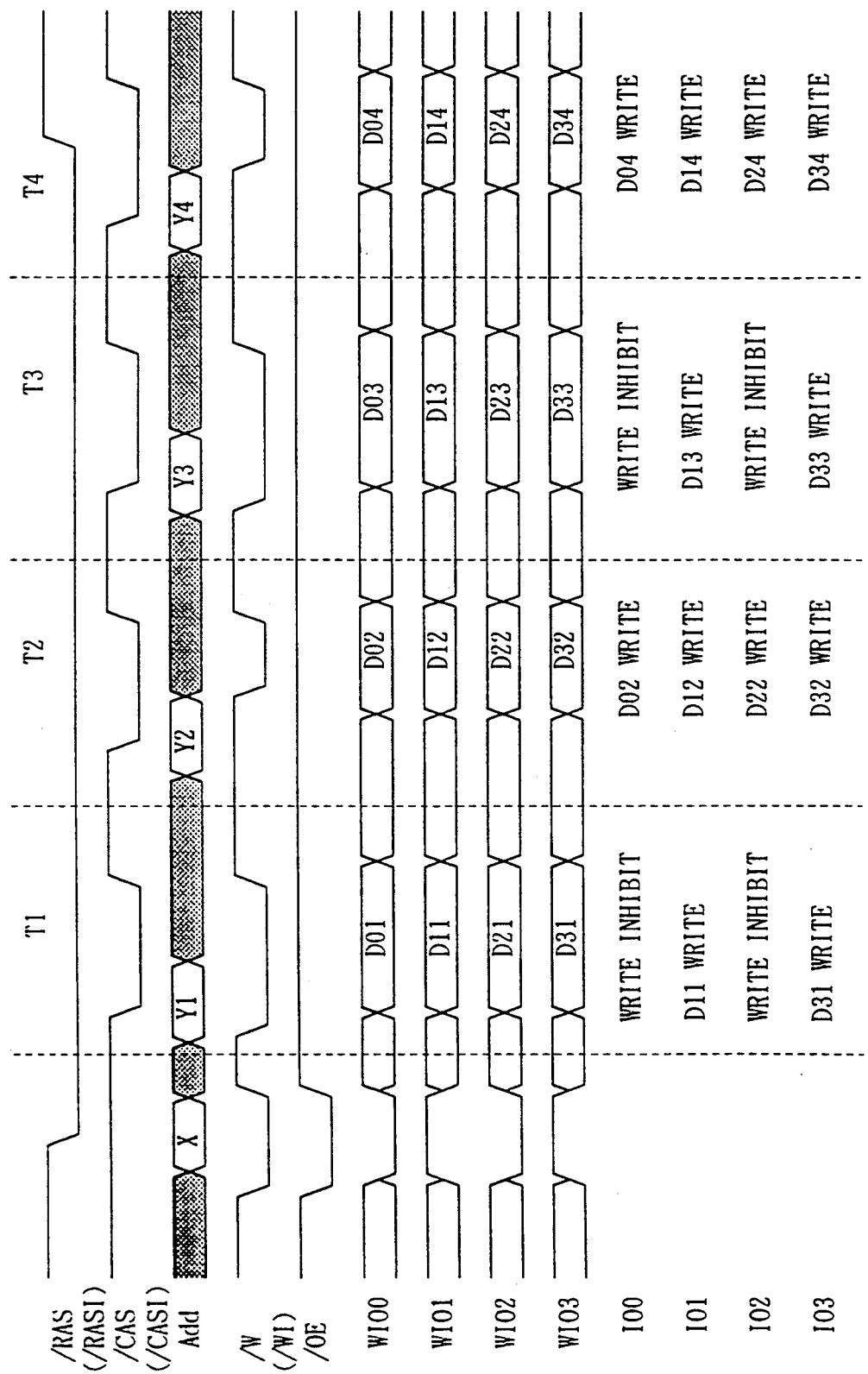
FIG. 17 is a timing chart showing a write per bit operation in page mode in the semiconductor memory device of the third embodiment.

Then, referring to a timing chart of FIG. 17, a write per bit operation in page mode of the semiconductor memory device of the third embodiment will be described below.

If the external data write control signal /W and external output enable signal /OE are "L" when the external row address strobe signal /RAS falls, the mask control signal MC is "H", and each input circuit 10a is set at the first mode.

Further, the data at external data input terminals WIO0–WIO3 is fetched as the mask data MD0–MD3 in response to the fall of the external row address strobe signal /RAS. In the example shown in FIG. 17, the mask data MD0 and MD2 is "L" (write inhibit state), and the mask data MD1 and MD3 is "H" (write enable state).

In each of the CAS cycles T1 and T3, the external data write control signal /W is "L" when the external column address strobe signal /CAS falls. In this case, the mask information /MSK0–/MSK3 is equal to the mask data MD0–MD3, respectively. Therefore, the mask information /MSK0 and /MSK2 is "L" (write inhibit state), and the mask information /MSK1 and /MSK3 is "H" (write enable state). As a result, the data at external data input terminals WIO0 and WIO2 is not transmitted to the input/output lines IO0 and IO2, and the data at external data input terminals WIO1 and WIO3 is transmitted to the input/output lines IO1 and IO3 and is written in the memory array blocks B1 and B3.

In each of the CAS cycles T2 and T4, the external data write control signal /W is "H" when the external column address strobe signal /CAS falls. In this case, the mask information /MSK0–/MSK3 is "H" (write enable state). As a result, the data at external data input terminals WIO0–WIO3 is transmitted to the input/output lines IO0–IO3 and is written in the memory array blocks B0–B3.

In this manner, the mask information is controlled in each CAS cycle, depending on the state of the external data write control signal /W at the fall of the external column address strobe signal /CAS.

According to the third embodiment, since it is not necessary to add a control signal input terminal for supplying the write control signal DSF, the number of pins does not increase.

(4) Fourth Embodiment

Figure 18:
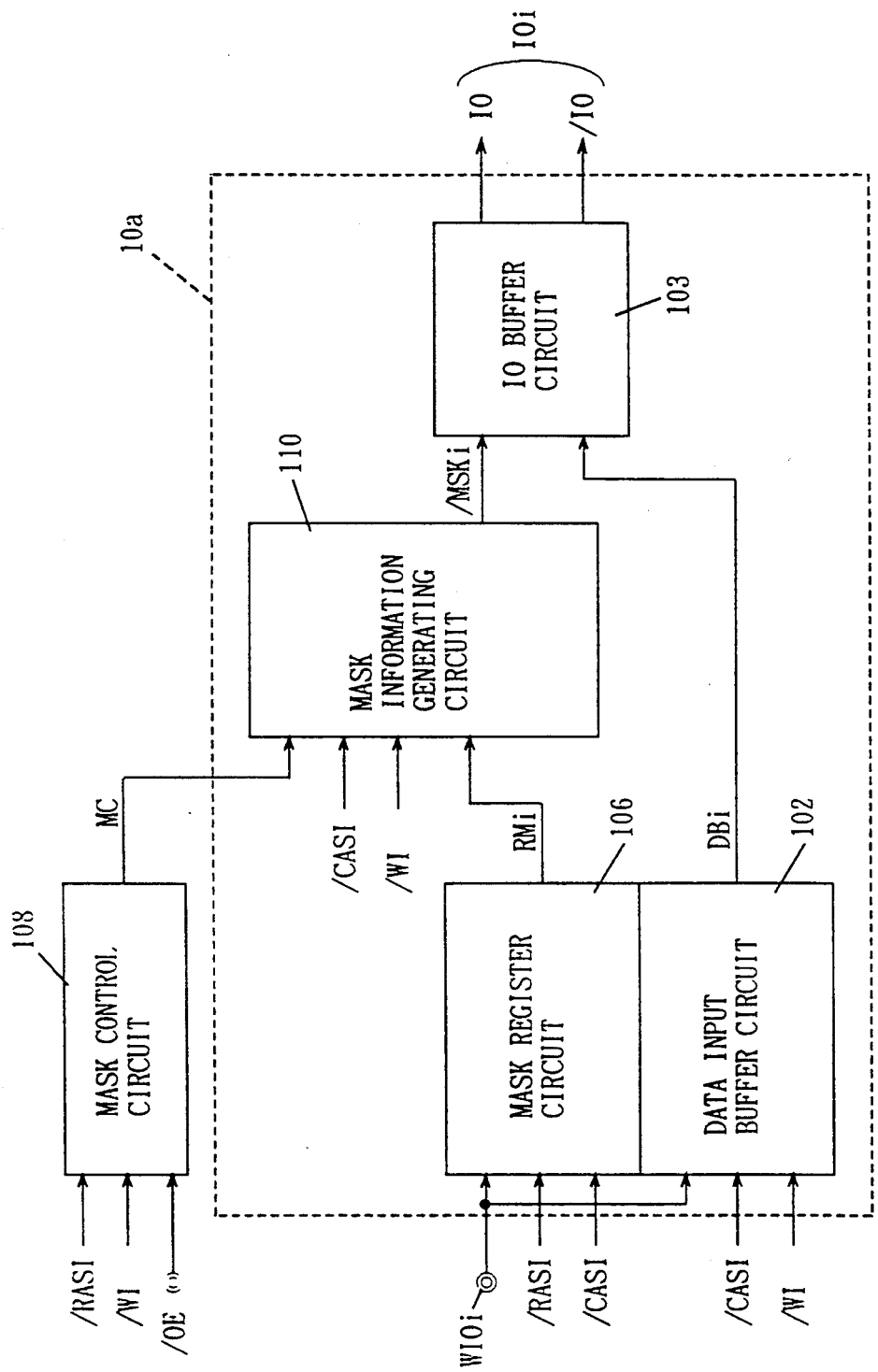
FIG. 18 is a block diagram showing a construction of an input circuit included in a semiconductor memory device of a fourth embodiment.

FIG. 18 is a block diagram showing a construction of one of input circuits 10a included in a semiconductor memory device of the fourth embodiment. The whole construction of the semiconductor memory device of this embodiment is similar to the whole construction of the semiconductor memory device of the third embodiment.

In FIG. 18, the input circuit 10a includes a mask register circuit 106, a data input buffer circuit 102, a mask information generating circuit 110 and an IO buffer circuit 103. The construction and operation of the mask register circuit 106 are similar to those of the mask register circuit 106 shown in FIG. 8, and the constructions and operations of the data input buffer circuit 102 and IO buffer circuit 103 are similar to those of the data input buffer circuit 102 and IO buffer circuit 103 shown in FIGS. 25 and 26. The construction and operation of the mask control circuit 108 is similar to those of the mask control circuit 108 shown in FIG. 14.

The mask information generating circuit 110 generates the mask information /MSKi in response to the internal signals /CASI and /WI, the mask control signal MC sent from the mask control circuit 108, and the mask register information RMi sent from the mask register circuit 106.

Figure 19:
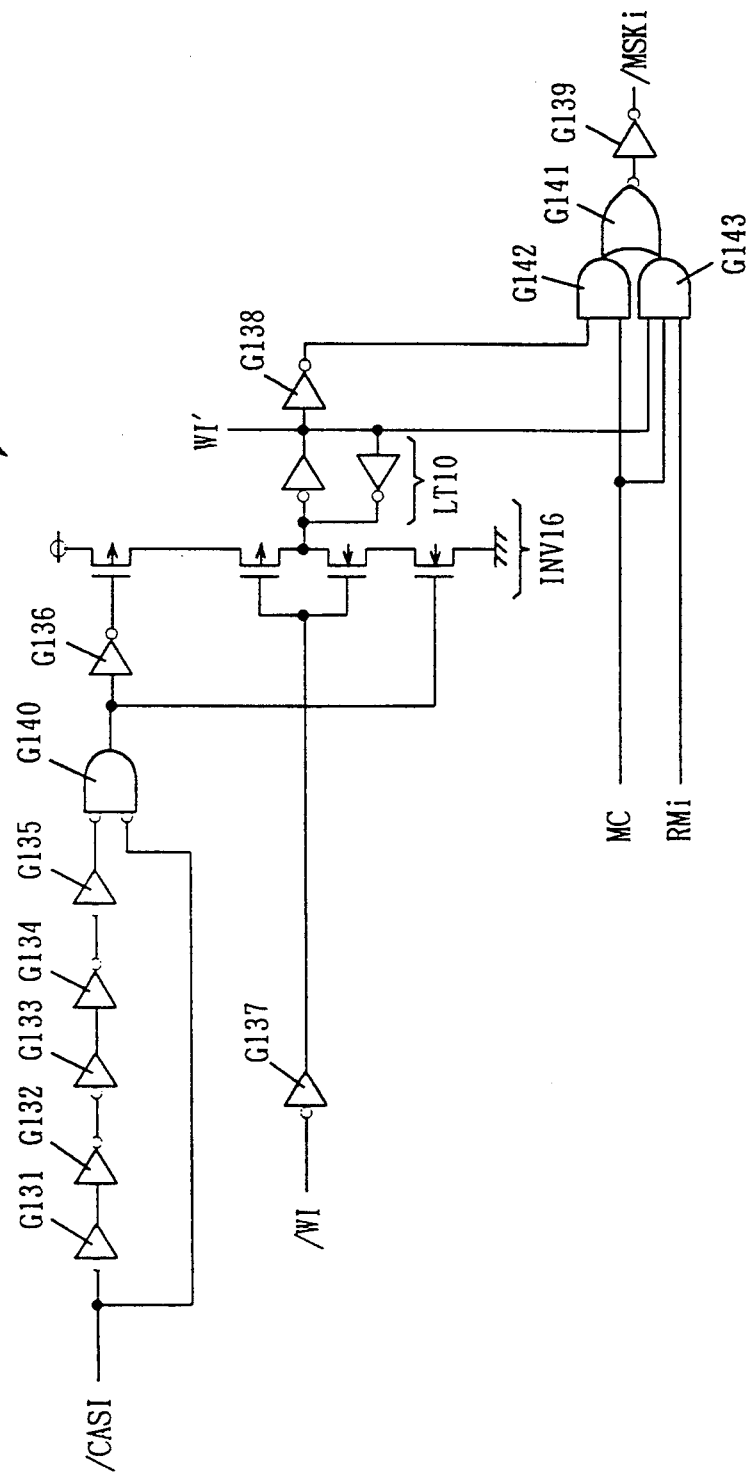
FIG. 19 is a circuit diagram showing a specific construction of a mask information generating circuit included in the input circuit in FIG. 18.

FIG. 19 is a circuit diagram showing a specific construction of the mask information generating circuit 110 shown in FIG. 18. The mask information generating circuit 110 includes inverters G131-G139, NOR gates G140 and G141, AND gates G142 and G143, an inverter circuit INV16 and a latch circuit LT10.

When the internal signal /CASI falls to "L", the output of NOR gate G140 is maintained at "H" for a predetermined time period. Thereby, the inverter circuit INV16 is activated for the predetermined time period. Thus, the internal signal /WI is fetched through the inverter G137 and inverter circuit INV16 to the latch circuit LT10. The latch circuit LT10 latches the internal signal /WI and outputs it as an internal signal WI'.

The inverters G138 and G139, AND gates G142 and G143, and NOR gate G141 carry out the logic operation for the internal signal WI' held by the latch circuit LT10, the mask control signal MC applied from the mask control circuit 108, and the mask register information RMi applied from the mask register circuit 106, whereby the mask information /MSKi is generated.

FIG. 20 shows a truth table of the mask information generating circuit 110 in FIG. 19.

If the external output enable signal /OE is "L" when the mask control signal MC is "H", i.e., at the fall of the internal signal /RASI, the input circuit 10a is set at the first mode for carrying out an operation peculiar to the invention. In this case, the mask information /MSKi is determined, depending on whether the external data write control signal /W has already fallen to "L" when the external column address strobe signal /CAS falls in each CAS cycle.

If the external data write control signal /W has already fallen to "L" when the external column address strobe signal /CAS falls in each CAS cycle, the mask information /MSKi is equal to the mask register information RMi. Specifically, if the mask register information RMi is "H", the mask information /MSKi is "H" (write enable state). If the mask register information RMi is "L", the mask information /MSKi is "L" (write inhibit state). If the external data write control signal /W has not yet fallen to "L" when the external column address strobe signal /CAS falls in each CAS cycle, the mask information /MSKi is "H" (write enable state), and the writing of data is carried out.

If the external output enable signal /OE is "H" when the mask control signal MC is "L", i.e., at the fall of the internal signal /RASI, the input circuit 10a is set at the second mode for carrying out the operation similar to that of the conventional semiconductor memory device. In this case, the mask information /MSKi is equal to the mask register information RMi, regardless of the state of the external data write control signal /W in each CAS cycle.

Referring to a timing chart of FIG. 21, the write per bit operation in page mode of the semiconductor memory device of the fourth embodiment will be described below.

In the write per bit operation in page mode, as shown in FIG. 11, the data at external data input terminals WIO0-WIO3 is held by the mask register circuit 106 as the mask register information RM0-RM3 in the /CAS before /RAS cycle. In the example of FIG. 21, the mask register information RM0 and RM1 is set at "L", and the mask register information RM2 and RM3 is set at "H".

Figure 21:
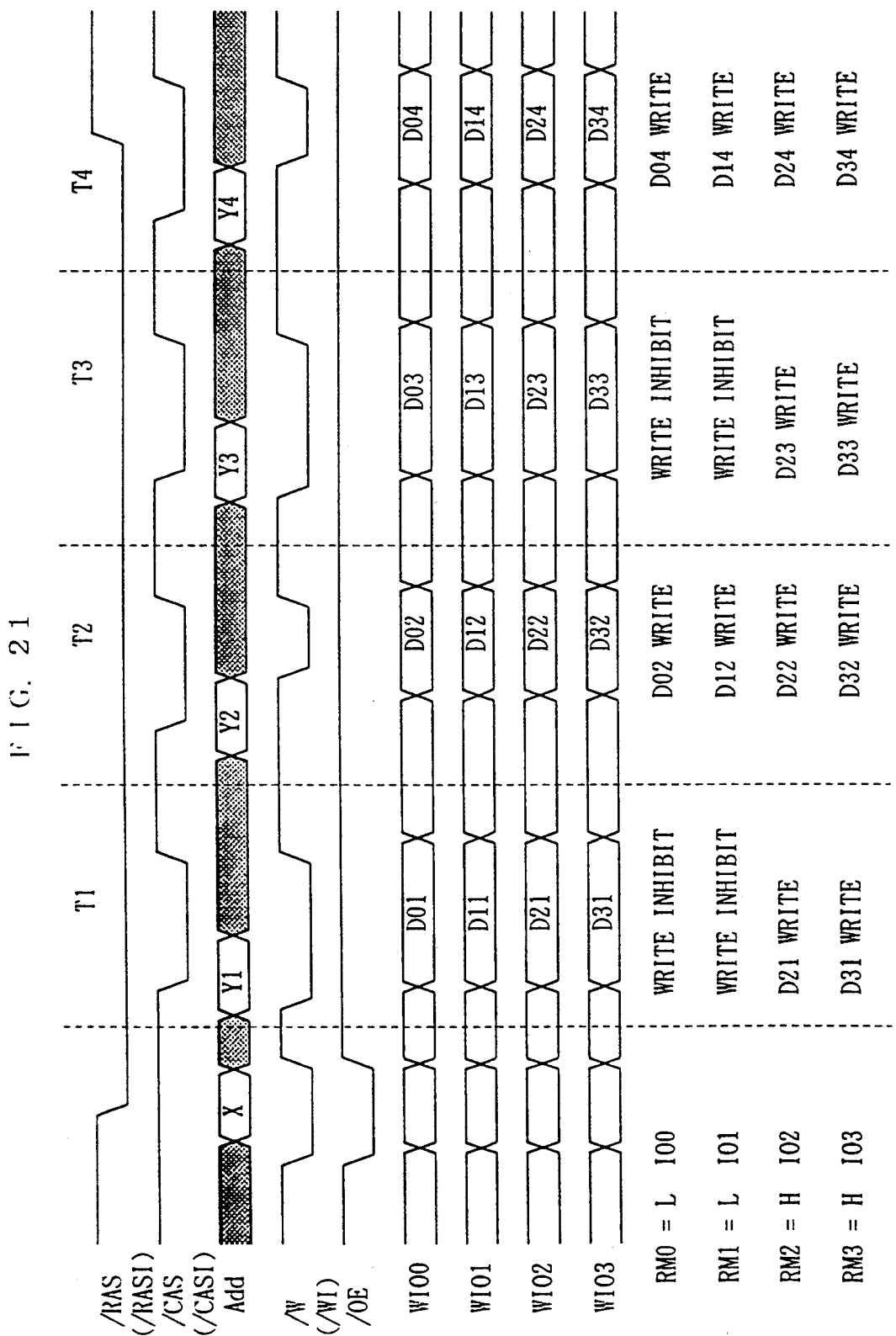
FIG. 21 is a timing chart showing a write per bit operation in page mode in the semiconductor memory device of the fourth embodiment.

As shown in FIG. 21, if the external data write control signal /W and external output enable signal /OE are "L" when the external row address strobe signal /RAS falls, the mask control signal MC is "H", and each input circuit 10a is set at the first mode.

In each of the CAS cycles T1 and T3, the external data write control signal /W is "L" when the external column address strobe signal /CAS falls. In this case, the mask information /MSK0-/MSK3 is equal to the mask register information RM0-RM3. Therefore, the mask information /MSK0 and /MSK1 is "L" (write inhibit state), and the mask information /MSK2 and /MSK3 are "H" (write enable state). As a result, the data at external data input terminals WIO0 and WIO1 is not transmitted to the input/output lines IO0 and IO1, and the data at external data input terminals WIO2 and WIO3 is transmitted to the input/output lines IO2 and IO3 and is written in the memory array blocks B2 and B3.

In each of the CAS cycles T2 and T4, if the external data write control signal /W is "H" when the external column address strobe signal /CAS falls, the mask information /MSK0-/MSK3 is "H" (write enable state). As a result, the data at external data input terminals WIO0-WIO3 is transmitted to the input/output lines IO0-IO3 and is written in the memory array blocks B0-B3, respectively.

In this manner, the mask information is controlled, depending on the state of the external data write control signal /W at the fall of the external column address strobe signal /CAS in each CAS cycle.

Also in the fourth embodiment, since it is not necessary to add a control signal input terminal for inputting the special function control signal DSF, the number of pins does not increase.

The mask information can be generated by carrying out the logic operation for an arbitrary one among the mask data MDi, the mask control signal MC, the special function control signal DSF at the fall of the external column address strobe signal /CAS, the internal signal /WI at the fall of the internal column address strobe signal /CAS, and the mask register information RMi in the mask information generating circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory arrays, each including a plurality of memory cells disposed in a plurality of rows and a plurality of columns;
   a row selecting means for selecting any one row in each of said plurality of memory arrays;
   a column selecting means for selecting any one column in each of said plurality of memory arrays;
   a control signal buffer for receiving control signals for controlling said column selecting means to repetitively carry out a column selecting operation in which said memory cells in a selected one row are sequentially selected while maintaining a state in which said row selecting means has selected one row in each of said plurality of memory arrays;
   a plurality of input means disposed corresponding to said plurality of memory arrays, and each providing externally applied data to a memory cell selected by said row selecting means and said column selecting means in a corresponding memory array;
   inhibiting means for inhibiting the input of data by an arbitrary one of said plurality of input means; and
   activating means for activating or deactivating said inhibiting means in each column selecting operation.

2. A semiconductor memory device according to claim 1, further comprising a control terminal for receiving a predetermined control signal, wherein
   said activating means activates or deactivates said inhibiting means in response to said predetermined control signal.

3. A semiconductor memory device according to claim 1, wherein
   said column selecting means carries out a column selecting operation in response to a column selection control signal;
   each of said plurality of input means carries out an input operation in response to a write control signal; and
   said activating means activates or deactivates said inhibiting means in response to said write control signal at the change of said column selection control signal.

4. A semiconductor memory device according to claim 2, wherein
   said row selecting means carries out a row selecting operation in response to a row selection control signal;
   said column selecting means carries out a column selecting operation in response to a column selection control signal;
   each of said plurality of input means carries out an input operation in response to a write control signal;
   said inhibiting means includes:
   a plurality of mask data input means provided corresponding to said plurality of input means, each of said plurality of mask data input means inputting mask data in response to said row selecting control signal and said write control signal;
   said activating means includes:
   a plurality of mask information generating means provided corresponding to said plurality of mask data input means, each of said plurality of mask information generating means generating mask information in response to said predetermined control signal, said column selection control signal and mask data supplied from a corresponding one of said mask data input means; and
   each of said plurality of input means is activated or deactivated in response to said mask information supplied from a corresponding one of said mask information generating means.

5. A semiconductor memory device according to claim 2, wherein
   said column selecting means carries out a column selecting operation in response to a column selection control signal;
   said inhibiting means includes:
   a plurality of mask register means provided corresponding to said plurality of input means, each of said plurality of mask register means holding mask data in advance;
   said activating means includes:
   a plurality of mask information generating means provided corresponding to said plurality of mask register means, each of said mask information generating means generating mask information in response to said predetermined control signal, said column selection control signal and mask register information supplied from a corresponding one of said mask register means; and
   each of said plurality of input means is activated or deactivated in response to said mask information supplied from a corresponding one of said mask information generating means.

6. A semiconductor memory device according to claim 3, wherein
   said row selecting means carries out a row selecting operation in response to a row selection control signal;
   said inhibiting means includes:
   a plurality of mask data input means provided corresponding to said plurality of input means, each of said plurality of mask data input means inputting mask data in response to said row selection control signal and said write control signal;
   said activating means includes:
   a plurality of mask information generating means provided corresponding to said plurality of mask data input means, each of said plurality of mask information generating means generating mask information in response to said column selection control signal, said write control signal and mask data supplied from a corresponding one of said mask data input means; and
   each of said plurality of input means is activated or deactivated in response to said mask information supplied from a corresponding are of said mask information generating means.

7. A semiconductor memory device according to claim 3, wherein
   said inhibiting means includes:
   a plurality of mask register means which are provided corresponding to said plurality of input means, each of said plurality of mask register means holding mask register information in advance;
said activating means includes:
a plurality of mask information generating means provided corresponding to said plurality of mask register means, each of said plurality of mask information generating means generating mask information in response to said write control signal, said column selection control signal and mask register information supplied from a corresponding one of said register means; and
each of said plurality of input means is activated or deactivated in response to said mask information supplied from a corresponding one of said mask information generating means.

8. A semiconductor memory device according to claim 4, further comprising:
mask control means for setting said plurality of mask information generating means at a first mode or a second mode in response to said row selection control signal, said write control signal and said predetermined control signal;
wherein each of said plurality of mask information generating means is operable, in said first mode, to set said mask information at an enable state or an inhibit state, in response to mask data supplied from a corresponding one of said mask data input means if said predetermined control signal is in a first state when said column selection control signal changes, and to set said mask information at the enable state if said predetermined control signal is in a second state when said column selection control signal changes, and is operable, in said second mode, to output the mask data supplied from a corresponding one of said mask data input means, as said mask information.

9. A semiconductor memory device according to claim 5, wherein
said row selecting means carries out a row selecting operation in response to a row selection control signal;
each of said plurality of input means carries out an input operation in response to a write control signal;
said semiconductor memory device further comprising:
mask control means for setting said plurality of mask information generating means at a first mode or a second mode in response to said row selection control signal, said write control signal and said predetermined control signal, wherein each of said plurality of mask information generating means is operable, in said first mode, to set said mask information at an inhibit state or an enable state, in response to mask register information supplied from a corresponding one of said mask register means if said predetermined control signal is in a first state when said column selection control signal changes, and to set said mask information at the enable state if said predetermined control signal is in a second state when said column selection control signal changes, and is operable, in said second mode, to output the mask register information supplied from a corresponding one of said mask register means, as said mask information.

10. A semiconductor memory device according to claim 6, further comprising:
receiving means for receiving an output control signal; and
mask control means for setting said plurality of mask information generating means at a first mode or a second mode in response to said row selection control signal, said write control signal and said output control signal; wherein
each of said mask information generating means is operable, in said first mode, to set said mask information at an inhibit state, or an enable state in response to mask data supplied from a corresponding one of said mask data input means if said write control signal is in a first state when said column selection control signal changes, and to set said mask information at the enable state if said write control signal is in a second state when said column selection control signal changes, and is operable, in said second mode, to output the mask data supplied from a corresponding one of said mask data input means, as said mask information.

11. A semiconductor memory device according to claim 7, wherein
said row selecting means carries out a row selecting operation in response to a row selection control signal;
said semiconductor memory device further comprising:
receiving means for receiving an output control signal, and
mask control means for setting said plurality of mask information generating means at a first mode or a second mode in response to said row selection control signal, said write control signal and said output control signal, wherein
each of said mask information generating means is operable, in said first mode, to set said mask information at an inhibit state or an enable state in response to the mask register information supplied from a corresponding one of said mask register means if said write control signal is in a first state when said column selection control signal changes, and to set said mask information at the enable state if said write control signal is in a second state when said column selection control signal changes, and is operable, in said second mode, to output the mask register information supplied from a corresponding one of said mask register means, as said mask information.

12. An operating method of a semiconductor memory device comprising a plurality of memory arrays, each including a plurality of memory cells disposed in a plurality of rows and a plurality of columns; a row selecting means for selecting one arbitrary row in each of said plurality of memory arrays; and a column selecting means for selecting one arbitrary column in each of said plurality of memory arrays;
said method comprising the steps of:
repeating a column selecting operation of the column selecting means while maintaining a state in which said row selecting means selects one row in each of said plurality of memory arrays, to sequentially select memory cells in the selected one row;
inputting externally applied data to memory cells selected by said row selecting means and said column selecting means in each memory array;
inhibiting input of arbitrary data among the data applied to said plurality of memory arrays; and activating or deactivating said inhibiting step during each column selecting operation.

13. A method according to claim 12, wherein said step of activation or deactivation includes the step of activating or deactivating said inhibiting step in response to a predetermined control signal.

14. A method according to 12, wherein said step of activation or deactivation includes the step of activating or deactivating said inhibiting step in response to a write control signal obtained when a column selection control signal changes.

* * * * *